United States Patent [19]

Kawashima

[11] Patent Number: 5,452,246
[45] Date of Patent: Sep. 19, 1995

[54] STATIC SEMICONDUCTOR MEMORY DEVICE ADAPTED FOR STABILIZATION OF LOW-VOLTAGE OPERATION AND REDUCTION IN CELL SIZE

[75] Inventor: Shoichiro Kawashima, Kawasaki, Japan

[73] Assignee: Fujitsu Limited, Kawasaki, Japan

[21] Appl. No.: 187,454

[22] Filed: Jan. 28, 1994

[30] Foreign Application Priority Data

Jun. 2, 1993 [JP] Japan .................. 5-132063

[51] Int. Cl.⁶ .................. G11C 11/412; G11C 11/418
[52] U.S. Cl. .................. 365/154; 365/149; 365/185; 365/208
[58] Field of Search .............. 365/154, 149, 185, 208

[56] References Cited

U.S. PATENT DOCUMENTS

| | | | |
|---|---|---|---|
| 4,388,704 | 6/1983 | Bertin et al. | 365/185 |
| 4,408,303 | 10/1983 | Guterman et al. | 365/185 |
| 4,420,821 | 12/1983 | Hoffman | 365/185 |
| 4,459,560 | 2/1985 | Brice | 365/154 |
| 4,509,349 | 3/1985 | Mazin et al. | 365/154 |
| 4,532,609 | 7/1985 | Iizuka | 365/154 |
| 4,541,006 | 9/1985 | Ariizumi et al. | 365/154 |
| 4,590,508 | 5/1986 | Hirakawa et al. | 365/154 |
| 4,707,807 | 11/1987 | Cuppens et al. | 365/185 |
| 4,751,676 | 6/1988 | Monodomi | 365/149 |
| 4,780,751 | 10/1988 | Nishimoto | 365/154 |
| 4,805,147 | 2/1989 | Yamanaka et al. | 365/154 |
| 4,833,644 | 5/1985 | Plus et al. | 365/149 |
| 4,849,801 | 7/1989 | Honjyo et al. | 365/154 |
| 4,858,195 | 8/1989 | Soneda | 365/154 |
| 4,956,814 | 9/1990 | Houston | 365/154 |
| 4,984,200 | 1/1991 | Saitoo et al. | 365/154 |
| 5,018,102 | 5/1991 | Houston | 365/154 |
| 5,051,951 | 9/1991 | Macy et al. | 365/185 |
| 5,051,952 | 9/1991 | Gotou | 365/154 |
| 5,132,771 | 7/1992 | Yamanaka et al. | 365/154 |
| 5,239,196 | 8/1993 | Ikeda et al. | 365/154 |
| 5,327,376 | 7/1994 | Semi | 365/154 |

FOREIGN PATENT DOCUMENTS

| | | |
|---|---|---|
| 63-201989 | 8/1988 | Japan . |
| 2-284466 | 11/1990 | Japan . |
| 3-116488 | 5/1991 | Japan . |
| 4-172697 | 6/1992 | Japan . |

*Primary Examiner*—Joseph E. Clawson, Jr.
*Attorney, Agent, or Firm*—Armstrong, Westerman, Hattori, McLeland & Naughton

[57] ABSTRACT

In a static type semiconductor memory device having a memory cell, the memory cell includes a flip-flop which has first and second nodes, a first transfer gate transistor which is connected between a first bit line of a pair of complementary bit lines and the first node, a second transfer gate transistor which is connected between a second bit line of the pair of complementary bit lines and the second node, a first capacitor which is connected between a word line and the gate of the first transfer gate, and a second capacitor which is connected between the word line and the gate of the second transfer gate. By the structure, even if the cell ratio is made small, it is possible to achieve stable operation at a low operating voltage and possible, thereby, to achieve both low power consumption and a high degree of integration.

12 Claims, 27 Drawing Sheets

STATIC SEMICONDUCTOR MEMORY DEVICE ADAPTED FOR STABILIZATION OF LOW-VOLTAGE OPERATION AND REDUCTION IN CELL SIZE

BACKGROUND OF THE INVENTION

1. Field of the Invention

The present invention relates to a semiconductor memory device, more particularly, to a static random-access memory (referred to hereinafter as an SRAM) comprised of memory cells, the basic elements of which are flip-flops.

2. Description of the Related Art

In recent years, in the field of SRAMs, there has been active development in the area of devices which are configured with so-called high-load-resistance type memory cells or TFT (thin-film transistor) load type memory cells. In SRAMs of this type, as in other semiconductor memory devices, the achievement of a high level of integration requires that the memory cell surface area be made small, and to achieve this efforts are being made to shrink the size of the MOS transistors which make up the memory cells.

The need to achieve good reliability and low power consumption in these down-sized MOS transistors makes necessary memory cells that can operate stably at low voltages, and development of such memory cells is being actively pursued.

In memory cells of typical SRAMs in the past, the drive element is a pair of MOS transistors and corresponding load elements, which form a flip-flop, with an MOS transistor transfer gate transistor which responds to the word line potential connected between the input/output node of the flip-flop and a pair of complementary bit lines.

In this configuration, when the memory cell is selected, it is possible to read out data using a prior art method. In such cases, a current flows from one of the pair of complementary bit lines via the transfer gate transistor and drive transistor into the low-potential power supply line. When this happens, the potential at the connection point of the two transistors (one of the input/output nodes of the flip-flop) rises to a voltage level established by the gm (mutual conductance) of the transfer gate transistor and the gm of the drive transistor. As a result, the other drive transistor opposing this drive transistor goes into what is called a "weak" ON state, which causes the potential at the other input/output node of the flip-flop to drop.

In this type of operating mode, if both the proportion of drop in the potential of one of the input/output nodes of the flip-flop and the proportion of rise in the potential at the other input/output node are large, as described later, the data stored in this memory cell is inverted, thereby preventing the achievement of stable operation.

This problem becomes more pronounced at low operating voltages. While raising the operating voltage solves this problem, doing creates the another problem of increased power consumption.

To solve this problem, it is thought that the value of (MOS drive transistor drive ability)/(transfer gate transistor MOS transistor drive ability), that is, the ratio of the former to the latter (hereinafter referred to as the cell ratio) can be made large.

However, if this is done, the size of the MOS transistor for the drive element becomes large, resulting in relative increase in the surface area of the memory cell.

The problems involved with prior art will be described in detail later, in a comparison with preferred embodiments of the present invention.

SUMMARY OF THE INVENTION

The object of the present invention is to provide a static RAM capable of stable operation at a low voltage, and therefore capable of achieving a low power consumption and high degree of integration, even when the cell ratio is made small.

To achieve the above object, according to the first aspect of the present invention, there is provided a static type semiconductor memory device inducing a memory cell comprising: a flip-flop having first and second nodes; a first transfer gate transistor connected between a first bit line of a complementary pair of bit liens and a said first node; a second transfer gate transistor connected between the second bit line of said complementary pair of bit lines and a said second node; a first capacitor connected between a word line and the gate of said first transfer gate transistor; and a second capacitor connected between said word line and the gate of said second transfer gate transistor.

According to the second aspect of the present invention, there is provided a static type semiconductor memory device including a memory cell comprising: a first load element and a second load element, one end of each of which is connected to a first power supply line that supplies a high-potential power supply voltage; a first transistor, the drain of which is connected to the other end of said first load element, the source of which is connected to a second power supply line which supplies a low-potential power supply voltage, and the gate of which is connected to the other end said second load element; a second transistor, the drain of which is connected to the other end of said second load element, the source of which is connected to said second power supply line, and the gate of which is connected to the other end of said first load element; a third transistor, the drain of which is connected to a first of a pair of complementary bit lines and the source of which is connected to the other end of said first load element; a fourth transistor, the drain of which is connected to a second of said pair of complementary bit lines and the source of which is connected to the other end of said second load element; a first capacitor, one end of which is connected to a word line and the other end of which is connected to the gate of said third transistor; a second capacitor, one end of which is connected to said word line and the other end of which is connected to the gate of said fourth transistor; a first resistance means, one end of which is connected to the gate of said third transistor and the other end of which is connected to the other end of said first load element; a second resistance means, one end of which is connected to the gate of said fourth transistor and the other end of which is connected to the other end of said second load element; a third capacitor, one end of which is connected to said first bit line and the other end of which is connected to the gate of said third transistor; and a fourth capacitor, one end of which is connected to said second bit line and the other end of which is connected to the gate of said fourth transistor.

BRIEF DESCRIPTION OF THE DRAWINGS

The other objects and features of the present invention will be described in detail by way of preferred embodiments, with reference to the attached drawings, which are as follows.

DETAILED DESCRIPTION OF THE PREFERRED EMBODIMENTS

In the following description, the descriptions of elements having the sample reference symbols used in and with reference to the drawings have not been repeated.

Figure 1:
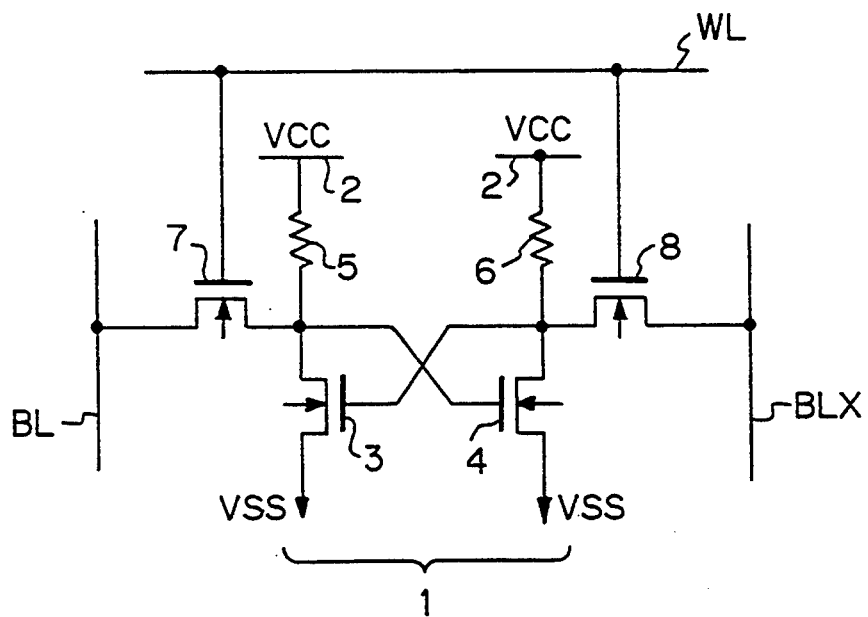
FIG. 1 is a circuit diagram of one example of the configuration of a memory cell provided in a prior art static RAM.
Figure 2:
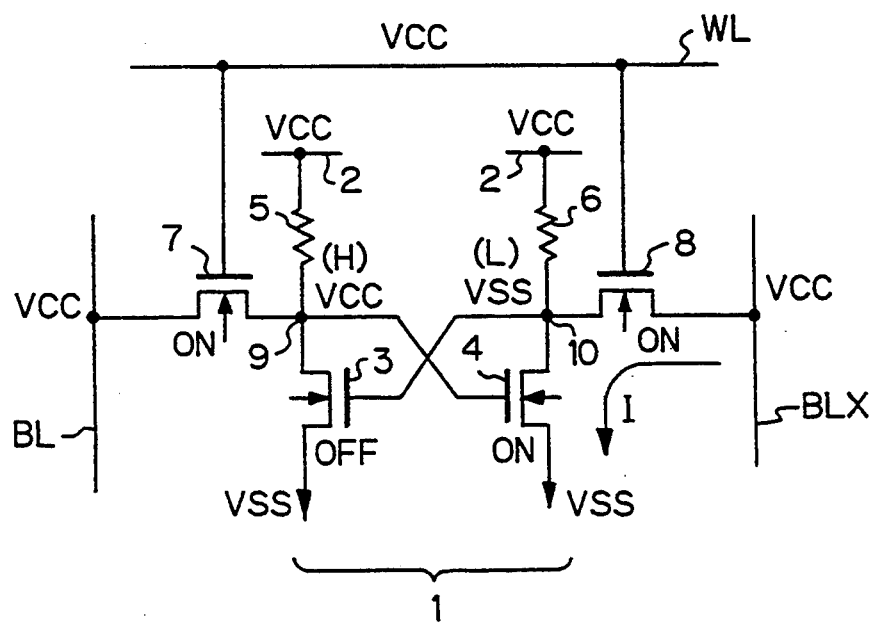
FIG. 2 is a circuit diagram showing the operating condition of the memory cell of FIG. 1 when it is selected during reading.
Figure 3:
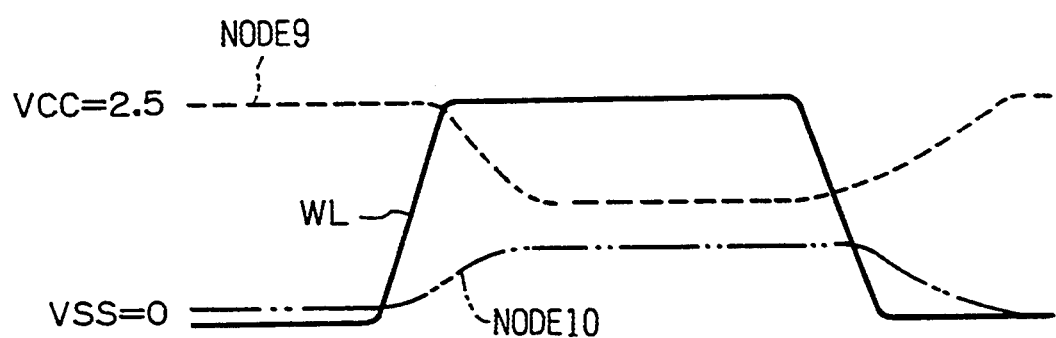
FIG. 3 is a signal waveform diagram showing the operation of the memory cell of FIG. 1 when it is selected during reading.

For a better understanding of the preferred embodiments of the present invention, first a description of the related prior art will be provided, making reference to FIG. 1 through FIG. 3.

FIG. 1 is one example of the configuration of a memory cell provided in a prior art static RAM.

In this drawing, 1 is a low-load-resistance type of flip-flop, 2 is the power supply line that supplies the VCC high power supply voltage (for example, 2.5 V), 3 and 4 are nMOS transistors which form the drive elements, 5 and 6 are high-value resistances which form the load elements, and VSS is the power supply line which supplies the low power supply voltage (for example, 0 V). 7 and 8 are nMOS transistors which form the transfer gates, WL is a word line which is connected to each of the transfer gates formed by transistors 7 and 8, and BL and BLX are a pair of complementary bit lines which form the data transfer path.

FIG. 2 shows the operational condition when the memory cell of FIG. 1 is selected during reading.

In the example shown in the drawing, the operational condition is shown in the case in which node 9=VCC (H level) and node 10=VSS (L level), that is, the case in which nMOS transistor 3 is OFF and nMOS transistor 4 is ON.

When reading data, if this memory cell is selected, in addition to bit lines BL and BLX being reset to VCC through the load (not shown in the drawing), word line WL=VCC and nMOS transistors 7 and 8 are ON. In this case, because a current I flows from bit line BLX through nMOS transistors 8 and 4 into the VSS power supply line, this current I is detected by a sensing amplifier (not shown in the drawing), so that data reading is performed.

However, when a current I flows from bit line BLX through nMOS transistors 8 and 4 into the VSS power supply line, as shown in FIG. 3, the potential at node 10 rises to a voltage level that is established by the gm of nMOS transistor 8 and the gm of nMOS transistor 4.

As a result, nMOS transistor 3 goes into the ON state and the potential at node 9 drops, this causing the gm of mMOS transistor 4 to become small, causing a further increase in the potential at node 10.

Therefore, the weak ON state of nMOS transistor 3 is strengthened, the potential at node 9 drops further, and ultimately the potential at node 9 drops to a voltage level at which a balance is achieved between the gm of nMOS transistor 7 and the gm of nMOS transistor 3.

In this case, if both the proportion of potential drop at node 9 and the proportion of potential rise at node 10 are large, the data stored in this memory cell is inverted, thereby preventing stable operation.

This type of problem becomes even more pronounced if the operating voltage, that is, the VCC power supply voltage is made low, such as the 2.5 V of the previous example. If the VCC supply voltage is made high, although it is possible to avoid inversion of stored data and to achieve stable reading operation, this prevents the achievement of low power consumption.

One possible solution to this problem is to make the value of (drive ability of the nMOS transistors 3 and 4 which form the drive elements)/(drive ability of the nMOS transistors 7 and 8 which form the transfer gates), that is, the cell ratio large in order to achieve stable operation even at a low operating voltage.

It is possible, of course, to make the cell ratio large, for example in the case in which node 9=VCC to limit the rise in the potential at node 10, so that the drop in potential at node 9 is also limited. Conversely, if node 10=VCC, since the rise in potential at node 9 can be made small, it is possible to limit the drop in potential at node 10 as well.

For this reason, in SRAMs in the past, the cell ratio was made greater than 5, for example, thereby achieving stable reading operation.

However, in such cases, it is necessary to make the nMOS transistors which form the drive elements large. This causes a relative increase in the surface area of the individual memory cells, thereby presenting the problem of preventing the achievement of a high level of integration.

In such SRAMs of the past, it was impossible to achieve both stable operation at low operating voltage (low power consumption) and a reduction in cell ratio (that is, high degree of integration).

Figure 4:
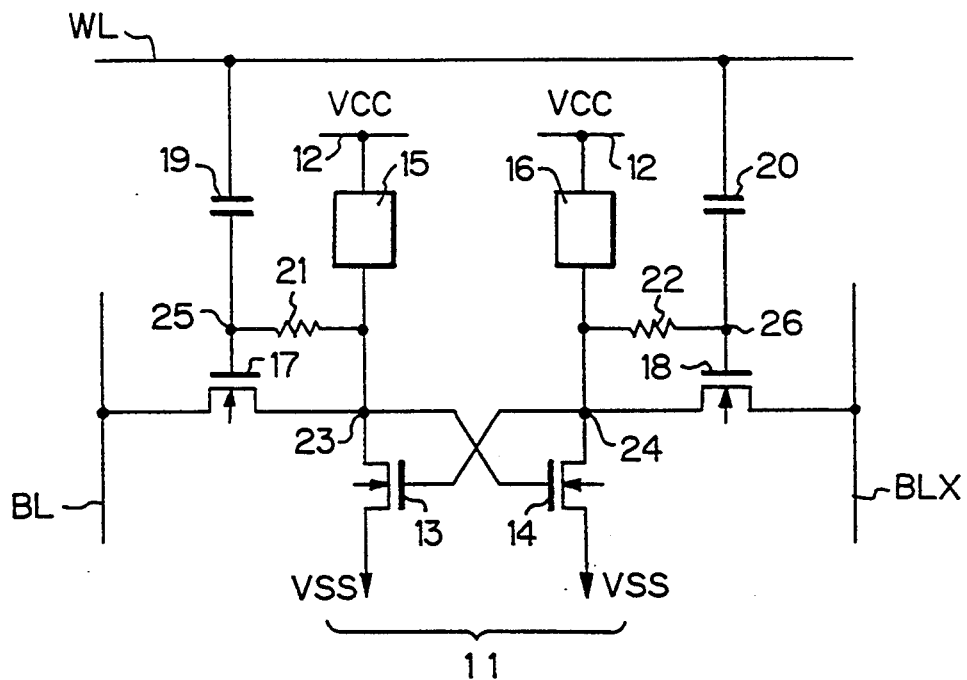
FIG. 4 is a diagram which shows the conceptual configuration (memory cell configuration) of a static RAM of the first aspect of the present invention.

FIG. 4 is a drawing which shows the conceptual configuration (memory cell configuration) of a static RAM of the first aspect of the present invention.

As shown in this drawing, an SRAM of this form comprises a memory cell that has a flip-flop as its basic element, this memory cell comprising first and second load elements 15 and 16, one end of each is connected to the power supply line which supplies the first VCC high power supply voltage, a first transistor 13, the drain of which is connected to the other end of the above-mentioned first load element, the source of which is connected to the second VSS power supply line which supplies the low power supply voltage, and the gate of which is connected to the other end of the above-mentioned second load element, a second transistor 14, the drain of which is connected to the other end of the above-mentioned second load element, the source of which is connected to the above-mentioned second power supply line, and the gate of which is connected to the other end of the above-mentioned first load element, a third transistor 17, the drain of which is connected to the first bit line BL of a pair of complementary bit lines and the source of which is connected to the other end of the above-mentioned first load element, a fourth transistor 18, the drain of which is connected to the second bit line BLX of the above-mentioned pair of complementary bits and the source of which is connected to the other end of the above-mentioned second load element, a first capacitor, one end of which is connected to a word line WL and the other end of which is connected to the gate of the above-mentioned third transistor, a second capacitor, one end of which is connected to the above-mentioned word line and the other end of which is connected to the gate of the above-mentioned fourth transistor, a first resistance means 21, one end of which is connected to the gate of the above-mentioned third transistor and the other end of which is connected to the other end of the above-mentioned first load element, a second resistance means 22, one end of which is connected to the gate of the above-mentioned fourth transistor and the other end of which is connected to the other end of the above-mentioned second load element.

Figure 5:
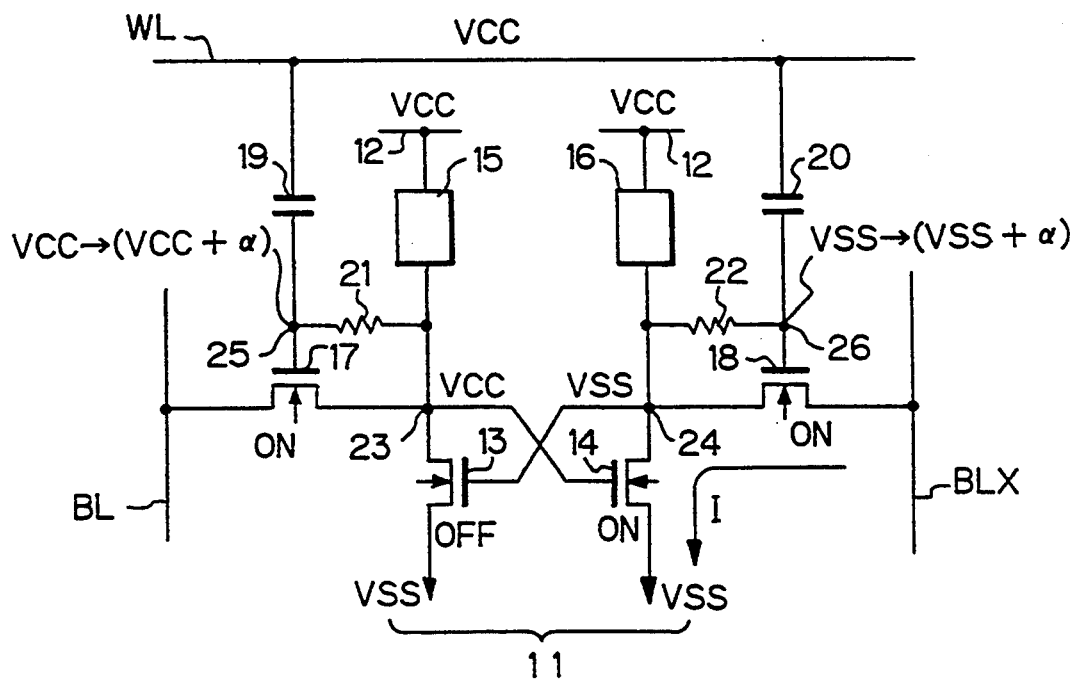
FIG. 5 is a circuit diagram which shows the operating condition of the memory cell of FIG. 4 when it is selected during reading.

FIG. 5 shows the operating condition of the memory cell of FIG. 4 when it is selected during reading.

The example shown in the drawing is the operating condition in the case in which node 23=VCC (H level) and node 24=VSS (L level), that is, the case in which transistor 13 is OFF, and transistor 14 is ON.

When reading data, if this memory cell is selected, in addition to bit lines BL and BLX being reset to VCC, the potential on word line WL is increased from VSS to VCC. In addition, because node 25 is connected to node 23 via resistance 21 and node 26 is connected to node 24 via resistance 22, if the potential at word line WL is VSS, node 265=VCC and node 26=VSS.

If from this condition word line WL is made VCC, by virtue of the coupling action of capacitors 19 and 20, the potential at node 25 rises to VCC+α and the potential at node 26 rises to VSS+α, so that transistor 18 goes into a strong ON state, and transistor 18 goes into a weak ON state.

As a result, because current I flows from bit line BLX through nMOS transistors 18 and 14 into the VSS power supply line, by detecting this current I, it is possible to perform reading. Also, when current I flows from bit line BLX through nMOS transistors 18 and 14 into the VSS power supply line, the potential at node 24 rises to a voltage level established by the gm of transistor 18 and the gm of transistor 14.

In this case, the potential at node 26 rises only to VSS+α, and the gm of transistor 18 becomes smaller than usual (that is, than the case in the past in which capacitor 20 was not provided), and the rise in the potential at node 24 is smaller than in the past.

Thus, whereas the rise in potential at node 24 is small, along with the rise in potential at this node, transistor 13 goes into the weak ON state, so that the potential at node 23 tends to drop.

However, with node 25=VCC+α, since transistor 17 is in a weak ON state, sufficient charge from the bit line BL is received at node 23, thereby preventing the potential at node 23 from dropping.

In this manner, in a memory cell of the form shown in FIG. 4, if node 23=VCC, in addition to limiting the rise in potential at node 24, it is possible to limit the drop in potential at node 23. Conversely, if node 24=VCC, in addition to limiting the rise in potential at node 23, it is possible to limit the drop in potential at node 24.

Therefore, because stored data is not inverted even if the cell ratio, that is, (drive ability of the nMOS transistors 13 and 14 which form the drive elements)/(drive ability of the nMOS transistors 7 and 8 which form the transfer gates) is made small, it is possible to achieve stable operation even at low operation voltage. That is, it is possible to achieve both low power consumption and a high level of integration.

Figure 6:
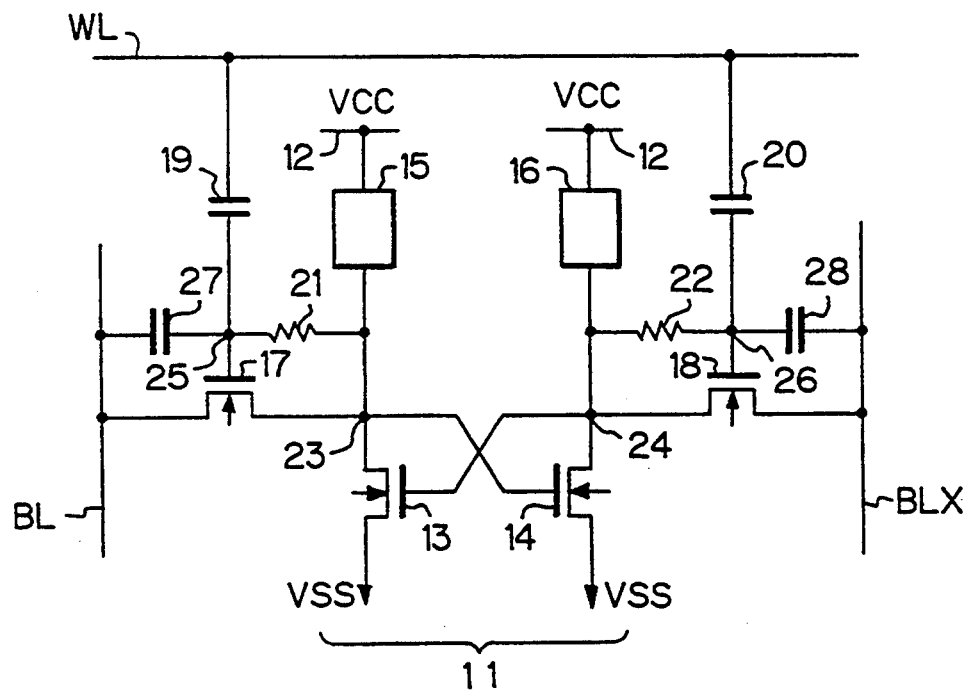
FIG. 6 is a diagram which shows the conceptual configuration (memory cell configuration) of a static RAM of the second aspect of the present invention.

FIG. 6 is a drawing which shows the conceptual configuration (memory cell configuration) of a static RAM of the second aspect of the present invention.

A feature of a memory cell of this form is the connection of capacitor 27 between one of the bit lines BL and the gate of the nMOS transistor 17, and the connection of capacitor 28 between the other bit line BLX and the gate of nMOS transistor 18. The remainder of the configuration is the same as the memory cell of the form shown in FIG. 4.

An SRAM of this form is an improvement of the SRAM of the first form (refer to FIG. 4), the reading operation of the memory cell being the same as shown in FIG. 4.

In the memory cell shown in FIG. 4, when the cell is selected during writing, if node 23=VCC and node 24=VSS, in accordance with the relationship of the other selected memory cells which share bit lines BX and BLX, when bit line BL=VSS and bit line BLX=VCC, nMOS transistor 17 is ON, thereby making node 23 VSS, so that there is a danger of destroying the stored data.

For this reason, in the memory cell shown in FIG. 4, when the memory cell is not selected during writing, if the work line WL is set to a voltage level more negative than the VSS level with node 23=VCC and node 24=VSS, even if bit line BL=VSS and bit line BLX=VCC, it is necessary to keep nMOS transistor 17 in the OFF state.

That is, if node 23=VCC and node 24=VSS, if because of the relationship of the other selected memory cells which share bit lines BL and BLX, the bit line BL level drops from VCC to VSS, and the level of bit line BLX is maintained at VCC, the coupling action of capacitor 27 causing node 25 be at a potential of VCC−α, so that nMOS transistor 17 goes into the weak ON state.

Although as a result node 25 becomes VCC and the stored data is destroyed, when the level on bit line BL is restored to VCC, in same manner the coupling action of capacitor 27 makes the node 27 VCC, so that the potential at node 23 is restored to VCC, thereby repairing the stored data.

Therefore, according to the form shown in FIG. 6, when the memory cell is not selected for writing, it is only necessary to maintain the potential at word line WL at VSS, eliminating the need for the negative voltage generating means which is needed in the memory cell shown in FIG. 4.

What follows is a detailed description of preferred embodiments of the present invention, with reference made to FIG. 7 through FIG. 36.

Figure 7:
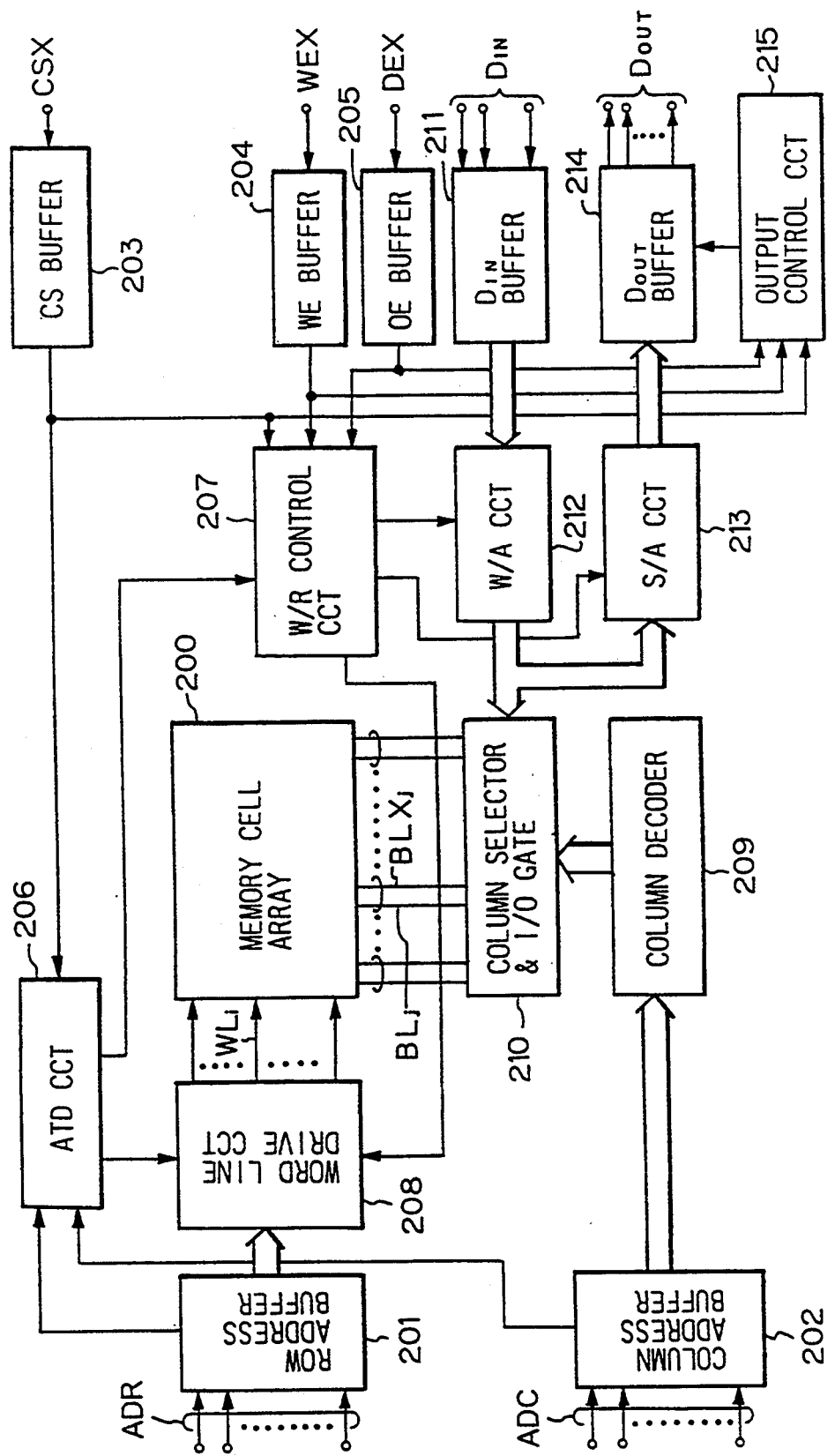
FIG. 7 is a block diagram which shows the overall configuration of a static RAM applied to each of the embodiments of the present invention.

FIG. 7 shows the overall configuration of a static RAM applied to the first and second embodiments of the present invention, which are described below.

In that drawing, 200 is a memory cell array (refer to the later-described FIG. 36) configured with memory cells with flip-flops as the basic elements positioned at the intersections of a plurality of word lines WLi and plurality of complementary bit lines pairs BLj and BLXj, 201 is a row address buffer which performs buffering of the row address ADR signals of the externally supplied address signals, 202 is a column address buffer which performs buffering of the column address ADC signals of the above-mentioned externally supplied address signals, 203 is a chip select (CS) buffer which performs buffering of the externally supplied active low chip select CSX signal, 204 is a write enable (WE) buffer which performs buffering of the active low write enable signal (write control signal) which is also externally supplied, 205 is an output enable (OE) buffer which performs buffering of the output enable OEX signal which is also externally supplied, 206 is an address transition detection (ATD) circuit which detects the change in logic levels of the address signals which are input via the address buffers 201 and 202, and 207 is a write/read (W/R) control circuit which controls the writing and reading of data, in response to the outputs of the control buffers 203 to 205 and the output of the address transition detection circuit 206.

208 is a word line drive circuit which in addition to selecting one of the plurality of word lines WLi based on the ADR row address signals, also controls the voltage levels of the selected word line in accordance with the output of the ATD (address transition detection) circuit 206 and in accordance with the control output of the W/R control circuit 207,209 is a column decoder which selects one of a plurality of columns based on the ADC column address signals, 210 is a column selector and input/output (I/O) gate for the purpose of making connection to the complementary bit lines BLj and BLXj which correspond to the selected column, 211 is a data input buffer which performs buffering of the input data (write data) DIN which is externally supplied, 212 is a write amplifier (W/A) circuit which amplifies the write data $D_{IN}$ and outputs it to the column selector and I/O gate 210, 213 is a sensing amplifier which amplifies the data which is read out via the column selector and I/O gate circuit, 214 is a data output buffer which performs buffering of the amplified readout data and outputs it as output data $D_{OUT}$, and 215 is an output control circuit which controls the data output buffer 214 in accordance with the output of each of the control buffers 203 to 205.

First Embodiment: Refer to FIG. 8 through FIG. 25

1. Configuration: Refer to FIG. 8 through FIG. 12.

Figure 8:
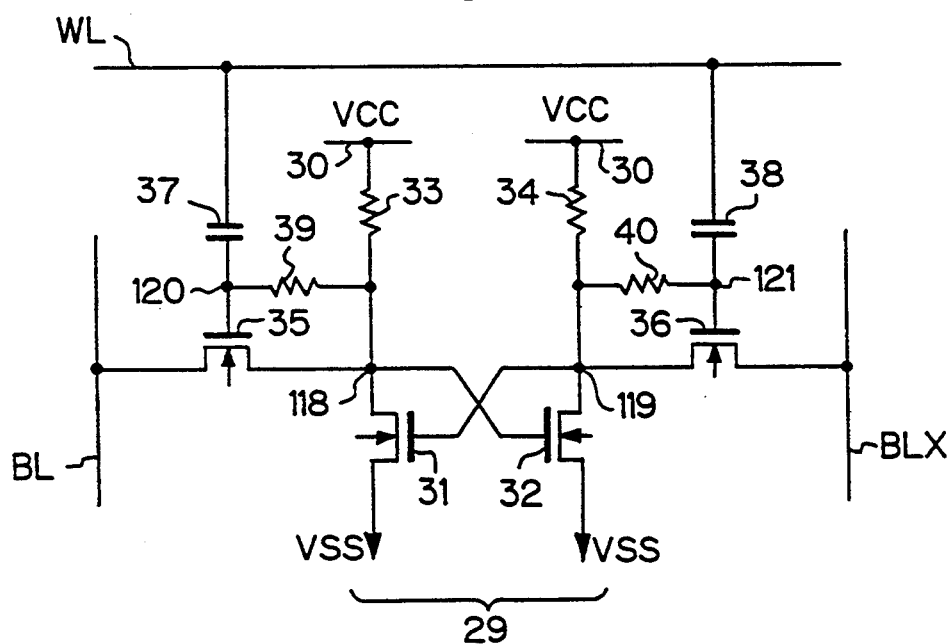
FIG. 8 is a circuit diagram which shows the configuration of the memory cell provided in a static RAM of the first embodiment of the present invention.

FIG. 8 shows the configuration of the memory cell provided in a static RAM of this embodiment.

In this drawing, 29 is high-load-resistance type flip-flop, 30 is a power supply line which supplies the VCC high potential (for example, 2.5 V), 31 and 32 are nMOS transistors which form the drive elements, 33 and 34 are high-value resistances which form the load elements, 35 and 36 are nMOS transistors which form the transfer gates, 37 and 38 are capacitors which have a capacitance of, for example, 1 fF, and 39 and 40 are resistors which have a resistance of, for example, 10 M$\omega$.

Essentially, in this embodiment, the time-constant circuit formed by capacitor 37 and resistor 39 and time-constant circuit formed by capacitor 38 and resistor 40 are both connected and configured so as to have a time constant of, for example, 10 ns.

Figure 9:
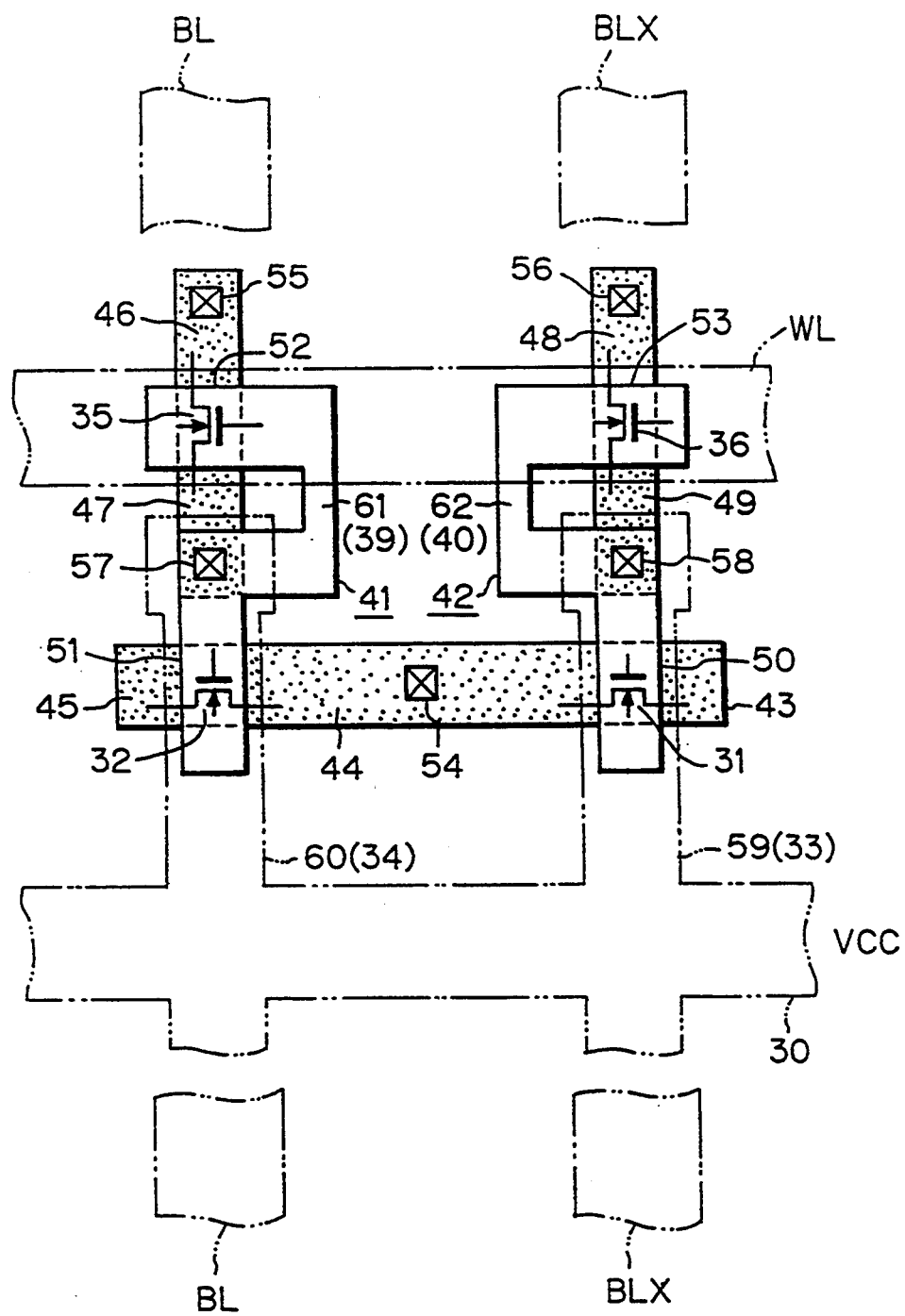
FIG. 9 is a top view which schematically shows the layout of the memory cell of FIG. 8.

FIG. 9 is a simplified top view which shows the layout of the memory cell of FIG. 8. In this drawing, 41 and 42 are polysilicon layers, and 43 through 49 are N-type diffusion layers. Part 50 of the polysilicon layer 42, part 51 of the polysilicon layer 41, part 52 of polysilicon layer 41, and part 53 of polysilicon layer 42 form the gates of nMOS transistors 31, 32, 35, and 36, respectively.

That is, in this embodiment, nMOS transistor 31 is formed by part 50 of polysilicon layer 42 and N-type diffusion layers 42 and 44, and nMOS transistor 32 is formed by part 51 of polysilicon layer 42 and N-type diffusion layers 44 and 45. In the same manner, nMOS transistor 35 is formed by part 52 of polysilicon layer 41 and N-type diffusion layers 46 and 47, and nMOS transistor 36 is formed by part 53 of polysilicon layer 42 and N-type diffusion layers 48 and 49.

54 is a contact hole which connects N-type diffusion layer 44 (the source of nMOS transistors 31 and 32) with the VSS power supply line (not shown in the drawing), 55 is a contact hole which connects N-type diffusion layer 46 (the drain of nMOS transistor 35) with the bit line BL, 56 is a contact hole which connects N-type diffusion layer 48 (the drain of nMOS transistor 36) with bit line BLX, 57 is a contact hole which connects part 51 of polysilicon layer 41 (the gate of nMOS transistor 35) with N-type diffusion layer 47 (the source of nMOS transistor 35), and 58 is a contact hole which connects part 50 of polysilicon layer 42 (the gate of nMOS transistor 31) with N-type diffusion layer 49 (the source of nMOS transistor 36).

The branch parts 59 and 60 of the VCC power supply line 30 form resistors 33 and 34, respectively, although the contact hole which connects branch part 59 (resistor 33) of the VCC power supply line 30 with part 50 of polysilicon layer 42 (the gate of nMOS transistor 31) is not shown in this drawing. In the same manner, the contact hole which connects branch part 60 (resistor 34) of the VCC power supply line 30 with part 51 of polysilicon layer 41 (the gate of nMOS transistor 32) is also not shown in this drawing. Parts 61 and 62 of polysilicon layers 41 and 42 form resistors 39 and 40, respectively.

Figure 10:
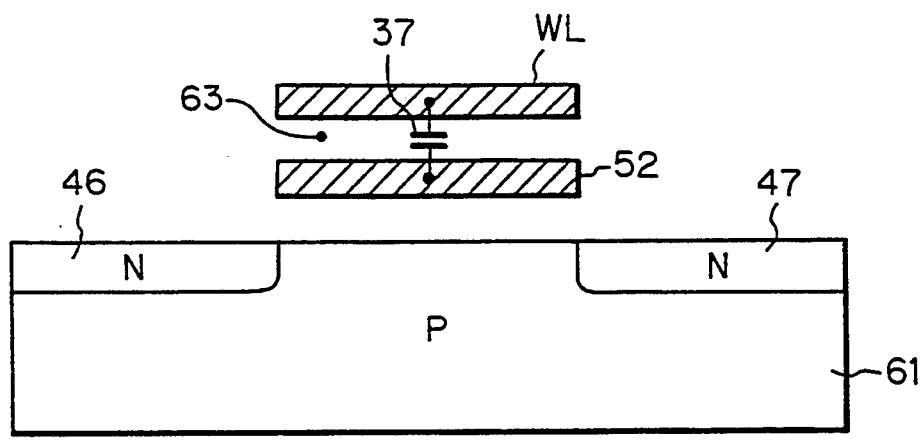
FIG. 10 is a cross-sectional view which schematically shows the configuration of one of the two capacitors provided in the memory cell of FIG. 8.

Capacitor 37, as shown in simplified cross-section in FIG. 10, is formed with one electrode as word line WL, the other electrode as part 52 of the polysilicon layer 41, and the insulation layer 63 between word line WL and part 52 of polysilicon layer 41 as the electrolytic layer.

Figure 11:
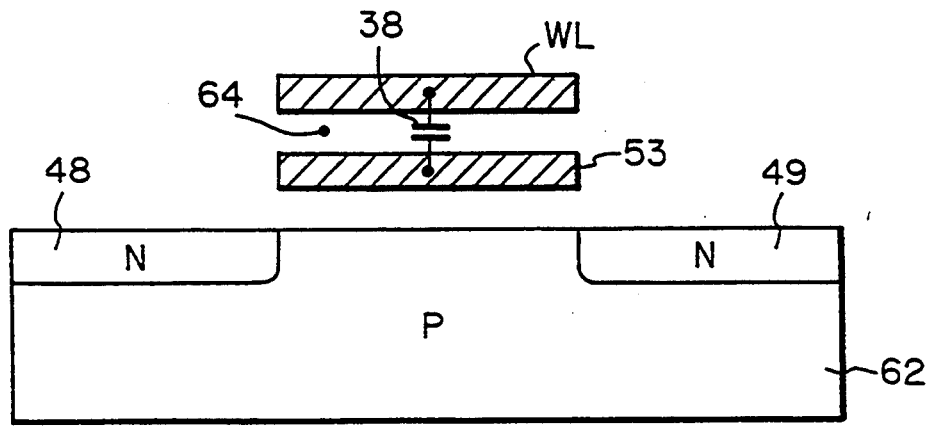
FIG. 11 is a cross-sectional view which schematically shows the configuration of the other of the two capacitors provided in the memory cell of FIG. 8.

In the same manner, capacitor 38, as shown in simplified cross-section in FIG. 11, is formed with one electrode as word line WL, the other electrode as part 53 of the polysilicon layer 42, and the insulation layer 64 between word line WL and part 53 of polysilicon layer 42 as the electrolytic layer.

Figure 12:
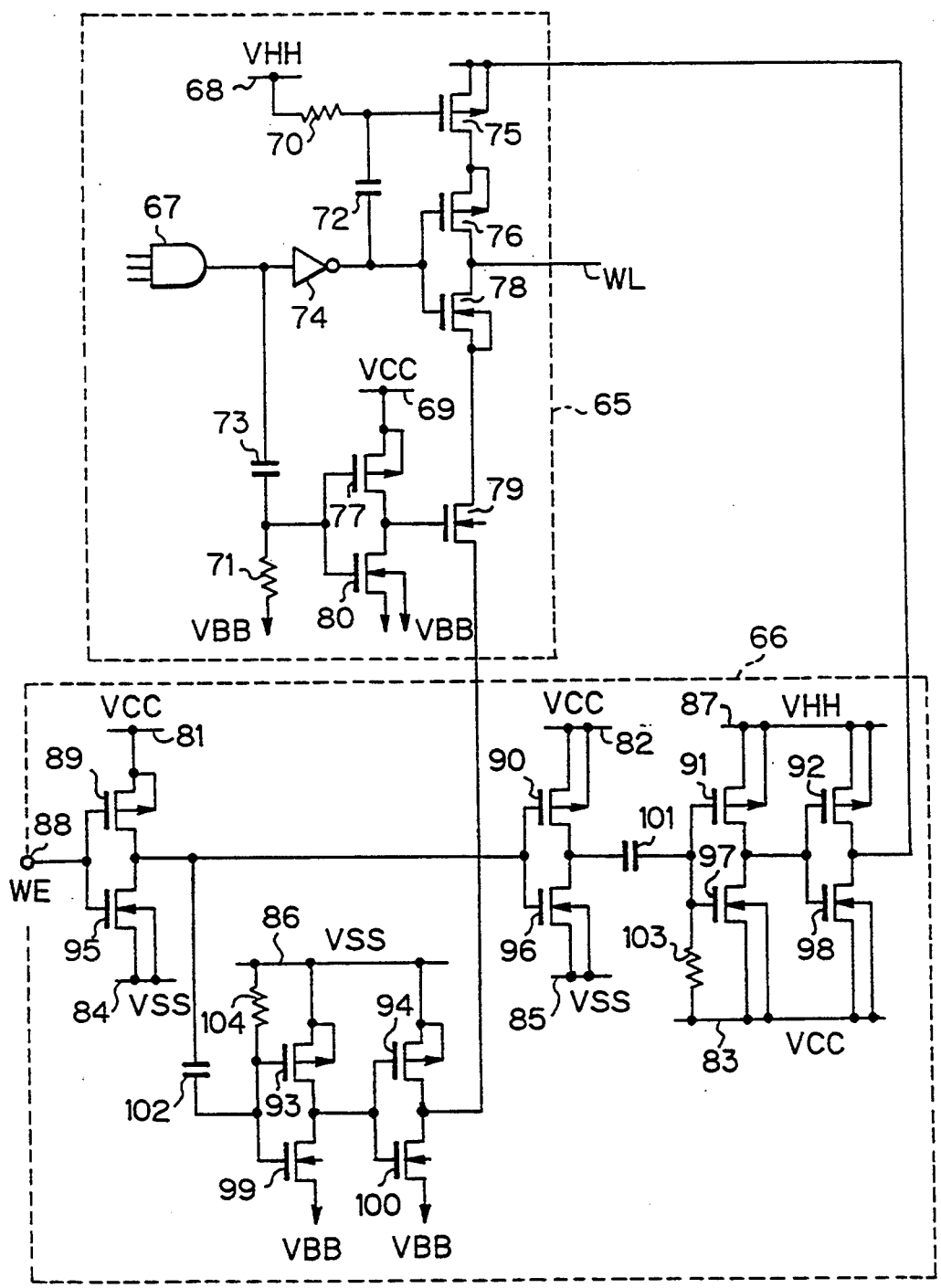
FIG. 12 is a circuit diagram which shows the configuration of the word decoder and write control circuits provided in the first embodiment of the present invention.

FIG. 12 shows the configuration of the word decoder and write control circuits provided in this embodiment.

In this drawing, 65 is a word decoder and 66 is a write control circuit, these circuits corresponding to the word line drive circuit 208 shown in FIG. 7.

In the word decoder 65, 67 is an AND circuit which decodes the internal row address signals, 68 is a VHH power supply line which supplies the high potential voltage VHH (for example, 5 V), 69 is a VCC power supply line which supplies the power supply voltage VHH (for example, 2.5 V), and VBB is a power supply line that supplies a negative voltage (for example $-2.5$ V). 70 and 71 are resistors, 72 and 73 are capacitors, 74 is an inverter, 75 through 77 are pMOS transistors, and 78 through 80 are nMOS transistors, a level-transforming circuit being formed by capacitor 73, resistor 71, pMOS transistor 77, and nMOS transistor 80.

In the write control circuit 66, 81 through 83 are VCC power supply lines, 84 through 86 are VSS power supply lines, and 87 is a VBB power supply line, 88 is the input terminal at which the write control signal WE is input. 89 through 94 are pMOS transistors, 95 through 100 are nMOS transistors, 101 and 102 are capacitors, and 103 and 104 are resistors.

A level-transformation circuit is formed by capacitor 101, resistor 103, pMOS transistors 91 and 92, and nMOS transistors 97 and 98. In the same manner, a level-transformation circuit is formed by capacitor 102, resistor 104, DMOS transistors 93 and 94, and nMOS transistors 99 and 100.

Figure 13:
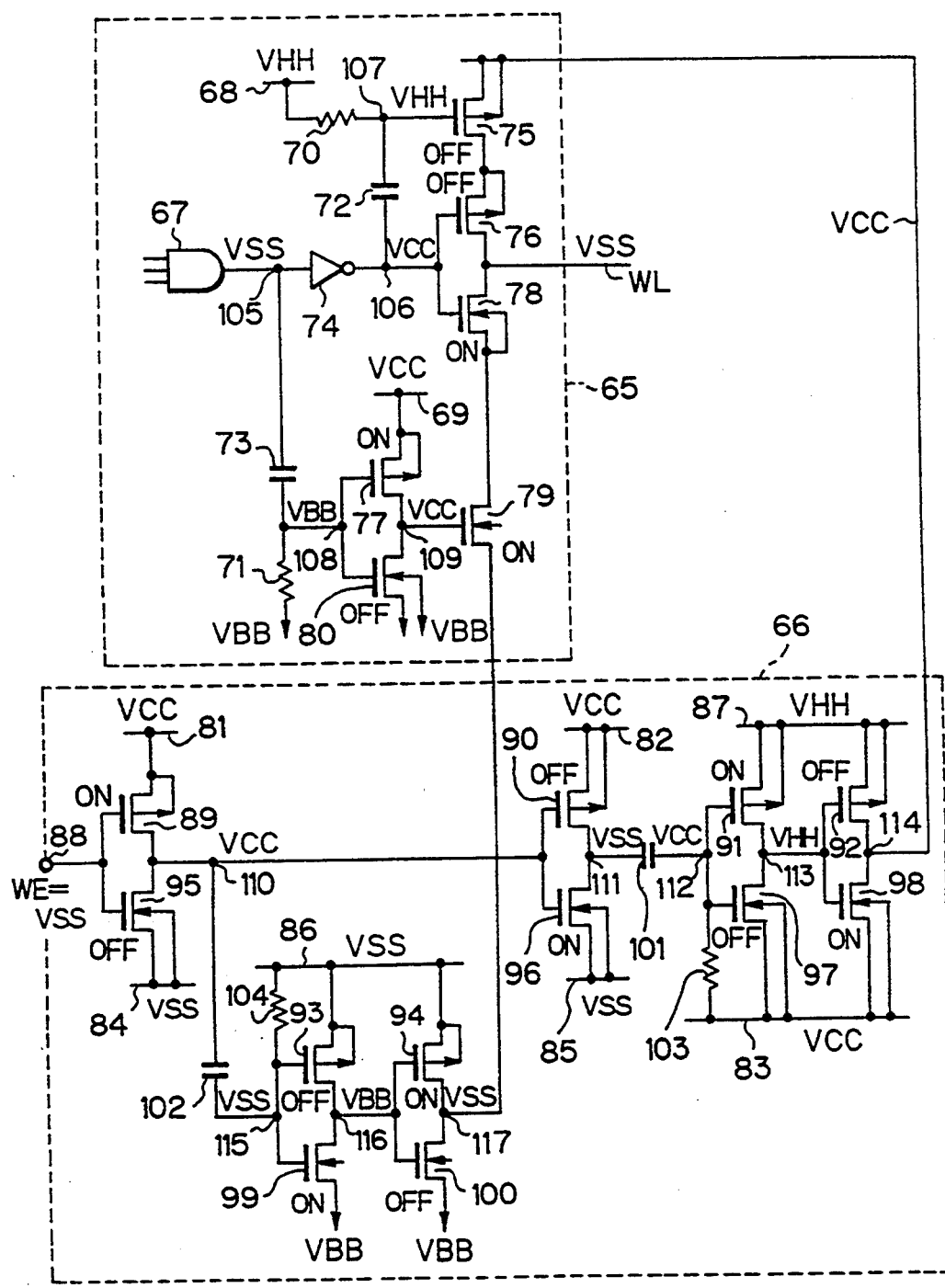
FIG. 13 is a circuit diagram which shows the operational condition of the circuit of FIG. 12 when the memory cell of FIG. 8 is not selected during reading.
Figure 14:
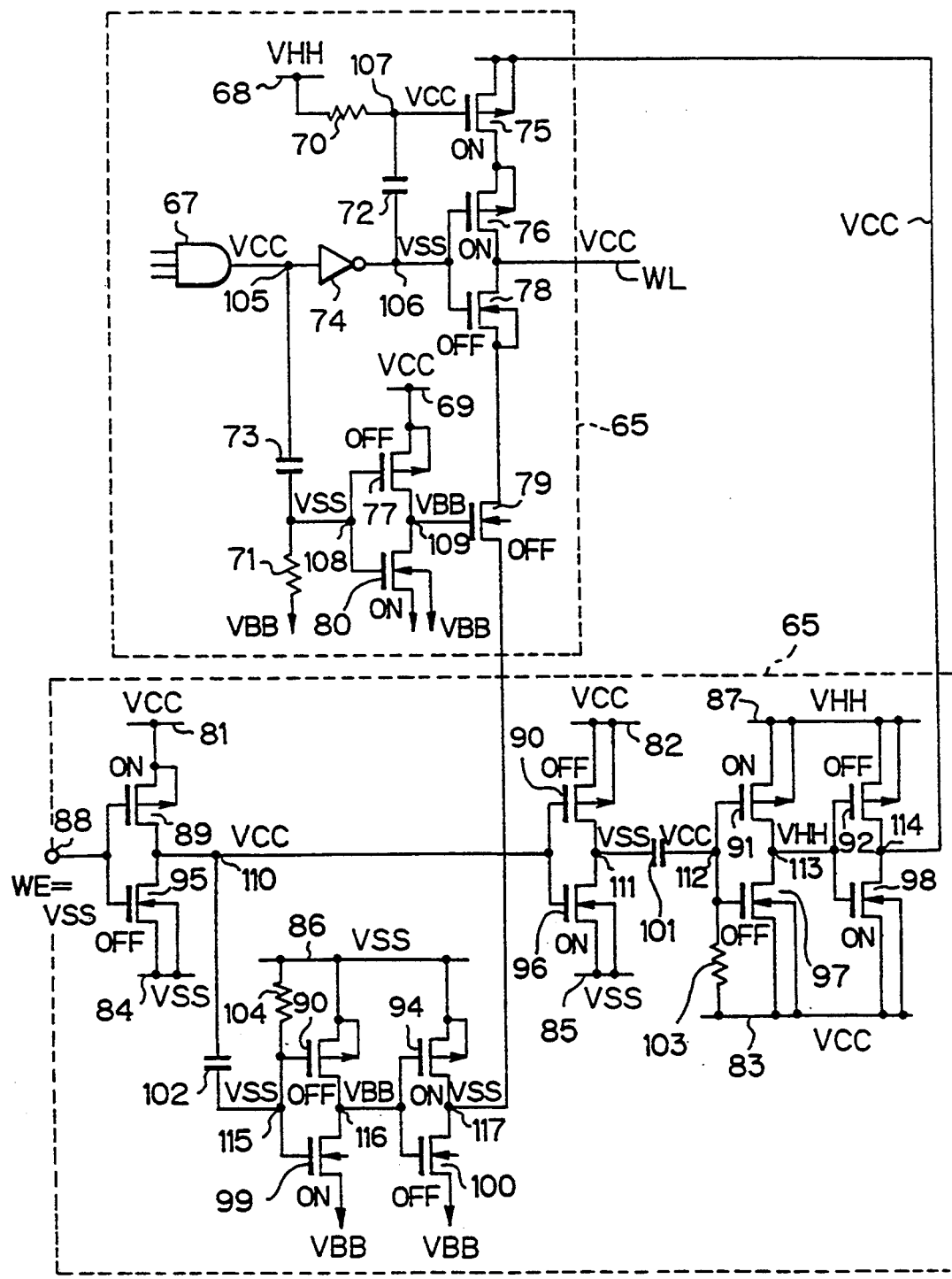
FIG. 14 is a circuit diagram which shows the operational condition of the circuit of FIG. 12 when the memory cell of FIG. 8 is selected during reading.
Figure 15:
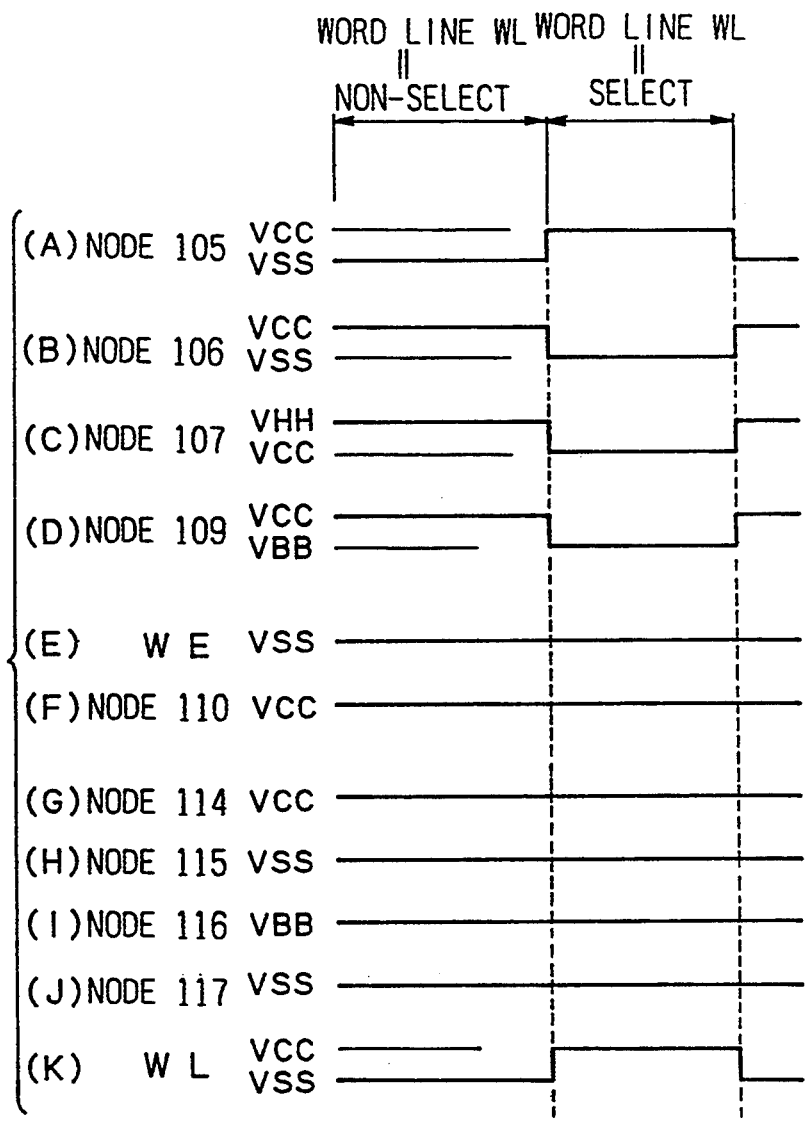
FIG. 15 is a signal waveform drawing which shows the operation of the circuit of FIG. 12 for reading.

2. Reading Operation of Word Decoder 65 and Write Control Circuit 66: Refer to FIG. 13 through FIG. 15.

FIG. 13 shows the operational condition of the word decoder 65 and write control circuit 66 when the memory cell of FIG. 8 is not selected during reading and in the same manner FIG. 14 shows the operating condition of each of the circuits 65 and 66 when the memory cell of FIG. 8 is selected during reading. FIG. 15 shows the operating signal waveforms of each of the circuits 65 and 66 when reading.

First, when reading, if word line WL is not selected (that is, if the memory cell shown in FIG. 8 is not selected), as shown in FIG. 13 and FIG. 15, node 15=VSS (FIG. 15 (A)), and write control signal WE=VSS (FIG. 15 (E)).

In this case, at the word decoder 65, in addition to node 106=VSS (FIG. 15 (B)), pMOS transistor 76 being OFF, and nMOS transistor 78 being ON, with node 107=VHH (FIG. 15 (H)), pMOS transistor 75 is OFF. In this case, with node 108=VBB, pMOS transistor 77 is ON, nMOS transistor 80 is OFF, node 109=VCC (FIG. 15 (D)), and nMOS transistor 79 is ON.

In the write control circuit 66, with pMOS transistor 89 ON and nMOS transistor 95 OFF, node 110=VCC (FIG. 15 (F)), nMOS transistor 96 is ON, and node 111=VSS. As a result, with node 112=VCC, pMOS transistor 91 is ON, nMOS transistor 97 is OFF, node 113=VHH, pMOS transistor 92 is OFF, nMOS transistor 98 is ON, and node 114=VCC (FIG. 15 (G)). In this case, with node 115-VSS (FIG. 15 (H)), pMOS transistor 93 is OFF, nMOS transistor 99 is ON, node 116=VBB (FIG. 15 (I)), pMOS transistor 94 is ON, nMOS transistor 100 is OFF, and node 117=VSS (FIG. 15 (J)).

Therefore, when reading, if the word line WL is not selected (that is, if the memory cell shown in FIG. 8 is not selected), word line WL=VSS (FIG. 15 (K)).

Next, if the word line WL is not selected when reading (that is, if the memory cell shown in FIG. 8 is not selected), as shown in FIG. 14 and FIG. 15, node 101=VCC (FIG. 15 (A)), and the write control signal WE=VSS (FIG. 15 (S)).

In this case, in the word decoder 65, in addition to node 106=VSS (FIG. 15 (E)), pMOS transistor 76 being ON, and nMOS transistor 78 being OFF, the coupling action of capacitor 72 makes node 107=VCC (FIG. 15 (C)), and pMOS transistor 75 is ON. In this case, the coupling action of capacitor 73 makes node 108=VSS, pMOS transistor 77 turns OFF, nMOS transistor 80 turns ON, node 109=VBB (FIG. 15 (D)), and nMOS transistor 79 is OFF.

In the write control circuit 66, with pMOS transistor 89 is ON and nMOS transistor 95 OFF, node 110=VCC (FIG. 15 (F)), pMOS transistor 90 is OFF, nMOS transistor 96 is ON, and node 111=VSS. As a result, with node 112=VCC, pMOS transistor 91 is ON, and with nMOS transistor 97 OFF, node 113=VHH, pMOS transistor 92 is OFF, nMOS transistor 98 is ON, and node 114=VCC (FIG. 15 (G)). In this case, with node 115=VSS (FIG. 15 (H)), pMOS transistor 93 is OFF, nMOS transistor 99 is ON, node 116=VBB (FIG. 15 (I)), pMOS transistor 94 is ON, nMOS transistor 100 is OFF, and node 117=VSS (FIG. 15 (J)).

Therefore, when reading if word line is selected (that is, if the memory cell of FIG. 8 is selected), word line WL=VCC (FIG. 15 (K)).

Figure 16:
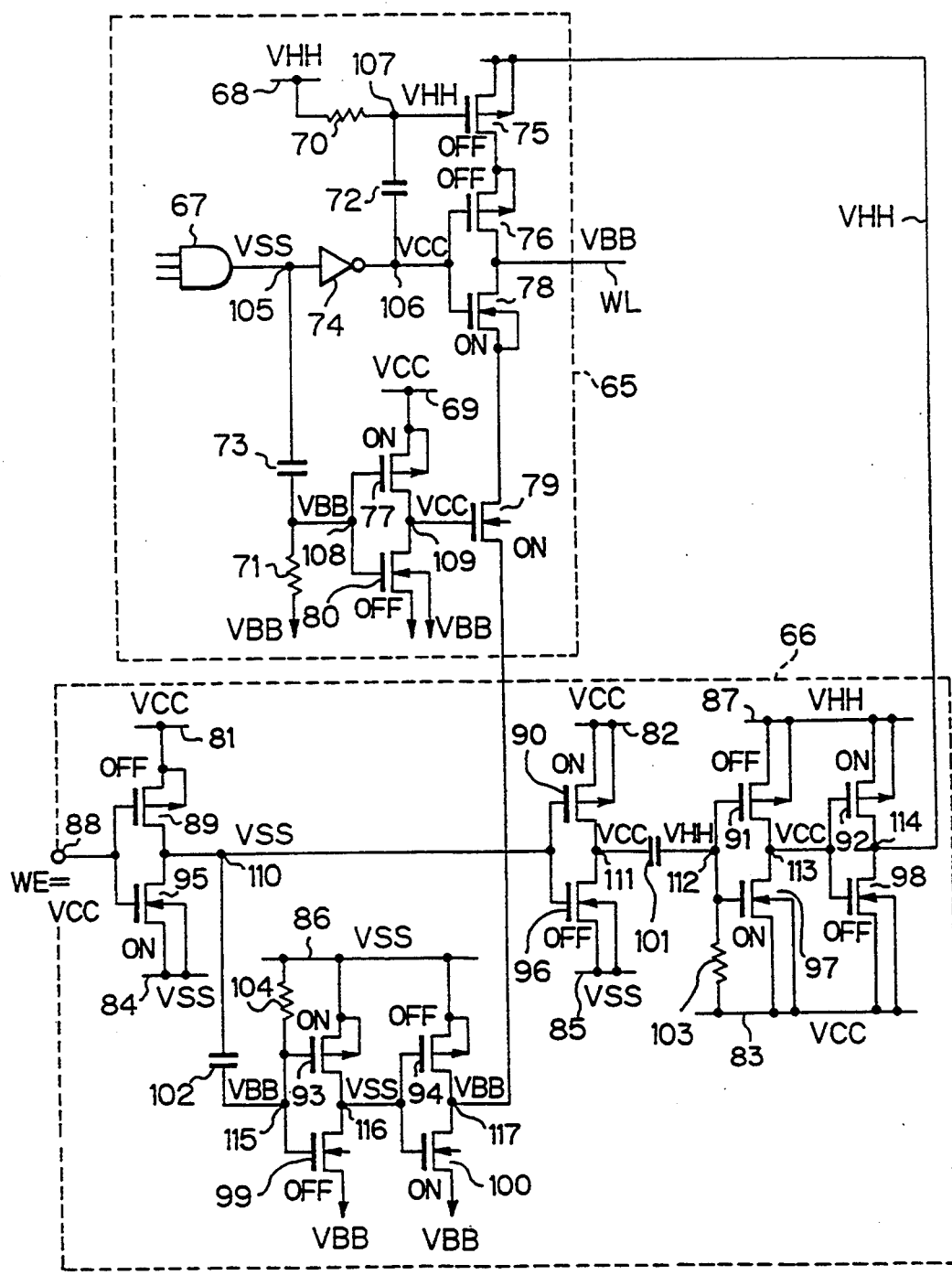
FIG. 16 is a circuit diagram which shows the operating condition of the circuit shown in FIG. 12 when the memory cell of FIG. 8 is not selected during writing.
Figure 17:
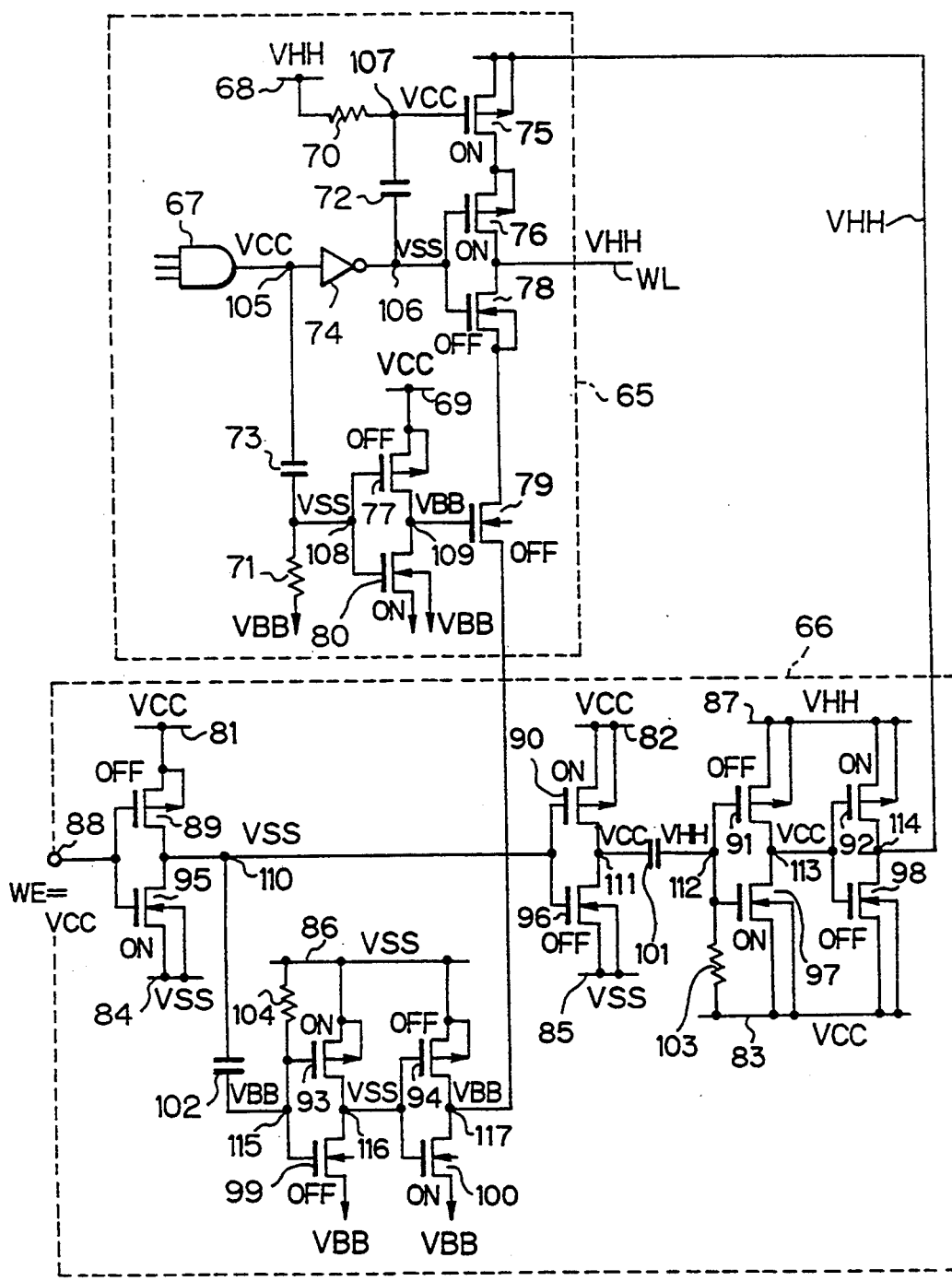
FIG. 17 is a circuit diagram which shows the operating condition of the circuit shown in FIG. 12 when the memory cell of FIG. 8 is selected during writing.
Figure 18:
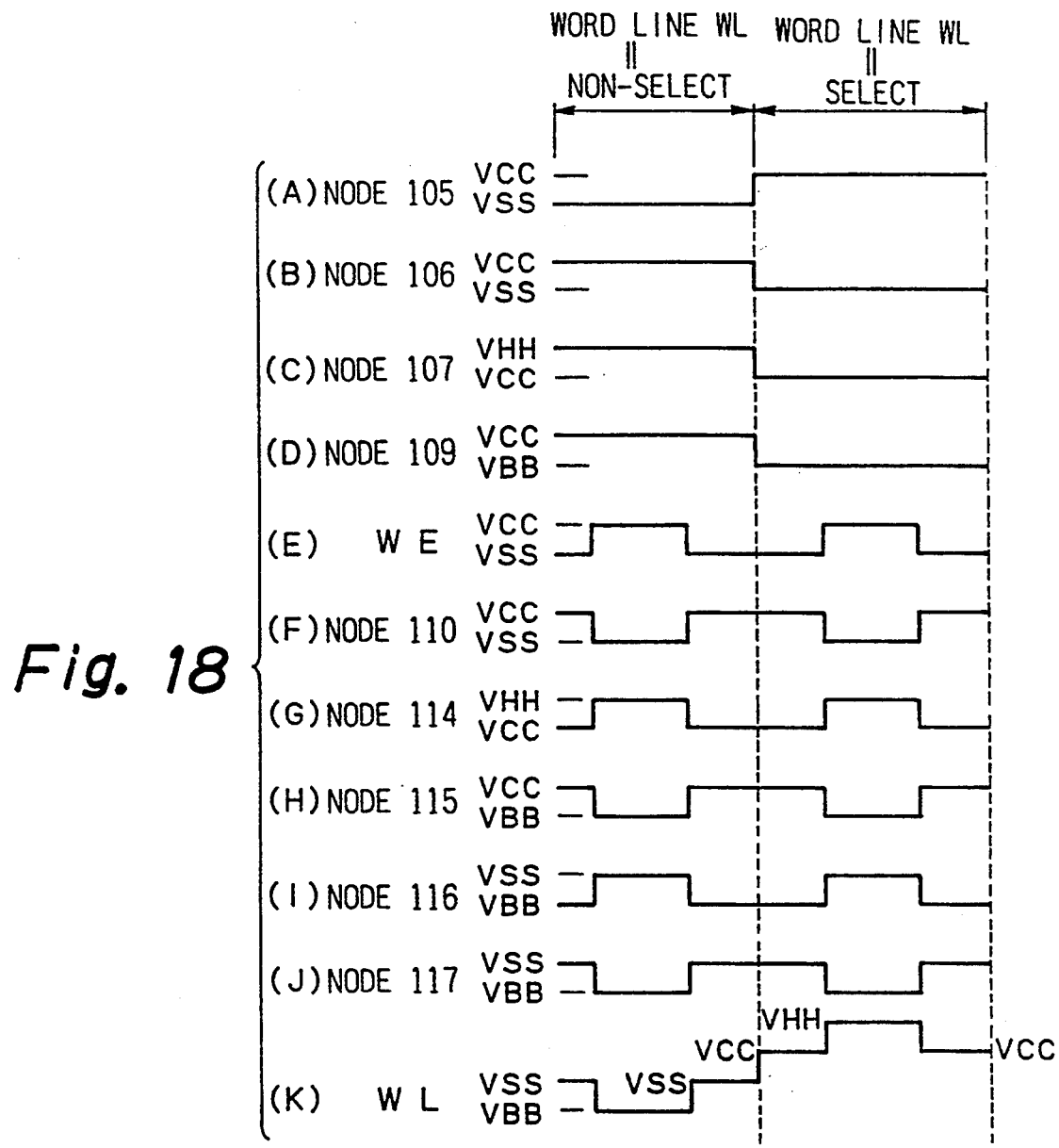
FIG. 18 is a signal waveform drawing which shows the operation of the circuit shown in FIG. 12 for writing.

3. Writing Operation of Word Decoder 65 and Write Control Circuit 66: Refer to FIG. 16 through FIG. 18.

FIG. 16 shows the operational condition of the word decoder 65 and write control circuit 66 when the memory cell of FIG. 8 is not selected during writing and in the same manner FIG. 17 shows the operating condition of each of the circuits 65 and 66 when the memory cell of FIG. 8 is selected during writing. FIG. 18 shows the operating signal waveforms of each of the circuits 65 and 66 when writing.

First, when writing, if word line WL is not selected (that is, if the memory cell shown in FIG. 8 is not selected), as shown in FIG. 16 and FIG. 18, node 15=VSS (FIG. 18 (A)), and write control signal WE rises from VSS to VCC (FIG. 18 (E)).

In this case, at the word decoder 65, in addition to node 106=VCC (FIG. 18 (B)), pMOS transistor 76 being OFF, and nMOS transistor 78 being ON, with node 107=VHH (FIG. 18 (C)), pMOS transistor 75 is OFF. In this case, with node 108=VBB, pMOS transistor 77 is ON, nMOS transistor 80 is OFF, node 109=VCC (FIG. 18 (D)), and nMOS transistor 79 is ON.

In the write control circuit 66, in the case in which the write control signal WE=VSS, as shown in FIG. 17, with pMOS transistor 89 ON and nMOS transistor 95 OFF, node 110=VCC (FIG. 18 (F)), pMOS transistor 90 is OFF, nMOS transistor 96 is ON, and node 111=VSS. As a result, with node 112=VCC, pMOS transistor 91 is ON, nMOS transistor 97 is OFF, node 113=VHH, pMOS transistor 92 is OFF, nMOS transistor 98 is ON, and node 114=VCC (FIG. 18 (G)). In this case, with node 115-VSS (FIG. 18 (H)), pMOS transistor 93 is OFF, nMOS transistor 99 is ON, node 116=VBB (FIG. 18 (I)), pMOS transistor 94 is ON, nMOS transistor 100 is OFF, and node 117=VSS (FIG. 18 (J)). As a result, word line WL=VSS.

If from this condition, as shown in FIG. 16, the write control signal WE is changed to VCC (FIG. 18 (E)), with pMOS transistor 89 OFF and nMOS transistor 95 ON, node 110=VSS (FIG. 18 (F)), pMOS transistor 90 is ON, nMOS transistor 96 is OFF, and node 111=VCC. As a result, because of the coupling action of capacitor 101, node 112=VHH, pMOS transistor 91 is OFF, nMOS transistor 97 is ON, node 113=VCC, pMOS transistor 92 is ON, nMOS transistor 98 is OFF, and node 114=VHH (FIG. 18 (G)). In this case, because of the coupling action of capacitor 102, node 115=VBB, pMOS transistor 93 is ON, nMOS transistor 99 is OFF, node 116=VSS, pMOS transistor 94 is OFF, nMOS transistor 100 is ON, and node 117=VBB.

Therefore, in the case in which the word line WL is not selected during writing (that is, when the memory cell shown in FIG. 8 is not selected), word line WL=VBB (FIG. 18 (K)).

Next, in the case in which the word line WL is selected during writing (that is, when the memory cell shown in FIG. 8 is selected), as shown in FIG. 17 and FIG. 18, after node 105 is set to VCC (FIG. 18 (A)), the write control signal WE rises from VSS to VCC (FIG. 18 (E)).

In this case, in the word decoder 65, in addition to node 106 being VSS (FIG. 18 (B)), pMOS transistor 76 being ON, and nMOS transistor being OFF, because of the coupling action of capacitor 72, node 107=VCC (FIG. 18 (C)), and pMOS transistor 75 is ON. In this case, because of the coupling action of capacitor 73, node 108=VSS, pMOS transistor 77 is OFF, nMOS transistor 80 is ON, node 109=VBB (FIG. 18 (D)), and nMOS transistor 79 is OFF.

In the write control circuit 66, in the case in which the write control signal WE=VSS, as shown in FIG. 17, with pMOS transistor 89 OFF and nMOS transistor 95 OFF, node 110=VCC (FIG. 18 (F)), pMOS transistor 90 is OFF, nMOS transistor 96 is ON, and node 111=VSS. As a result, with node 112=VCC, pMOS transistor 91 is ON, and with nMOS transistor 97 OFF, node 113=VHH, pMOS transistor 92 is OFF, nMOS transistor 98 is ON, and node 114=VCC (FIG. 18 (G)). As a result of this, with node 115=VSS (FIG. 18 (H)), pMOS transistor 93 is OFF, nMOS transistor 99 is ON, node 116=VBB (FIG. 18 (I)), pMOS transistor 94 is ON, nMOS transistor 100 is OFF, and node 117=VSS FIG. 18 (J)). As a result, word line WL=VSS.

If from this condition, as shown in FIG. 17, the write control signal WE is changed to VCC (FIG. 18 (E)), with pMOS transistor 89 OFF and nMOS transistor 95 ON, node 110=VSS (FIG. 18 (F)), pMOS transistor 90 is ON, nMOS transistor 96 is OFF, and node 111=VCC. As a result, because of the coupling action of capacitor 101, node 112=VHH, pMOS transistor 91 is OFF, nMOS transistor 97 is OFF, node 113=VCC, pMOS transistor 92 is ON, nMOS transistor 98 is OFF, and node 114=VHH (FIG. 18 (G)). As a result, because of the coupling action of capacitor 102, node 115=VBB, pMOS transistor 93 is ON, nMOS transistor 99 is OFF, node 116=VSS, pMOS transistor 94 is OFF, nMOS transistor 100 is ON, and node 117=VBB.

Therefore, in the case in which word line WL is selected during writing (that is, when the memory cell of FIG. 8 is selected), the word line WL=VHH (FIG. 18 (K)).

Figure 19:
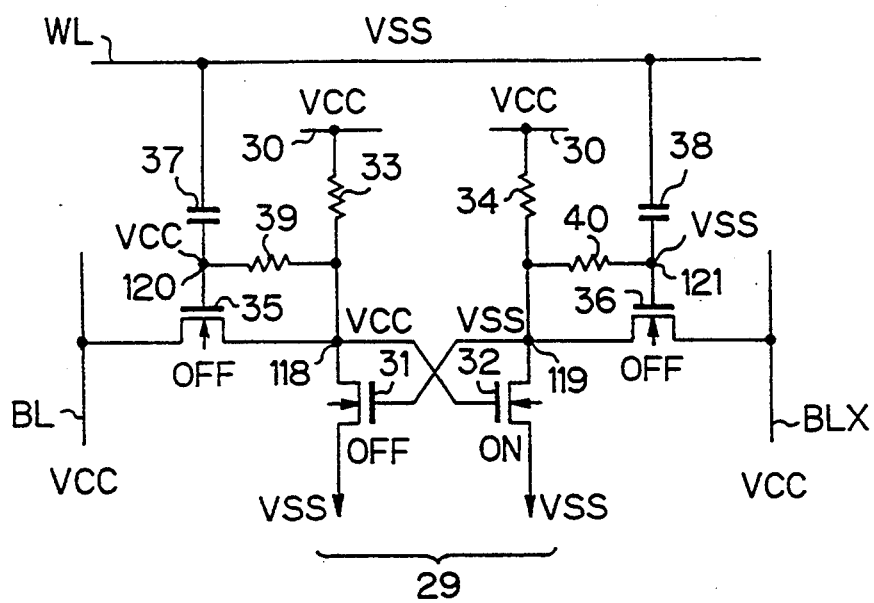
FIG. 19 is a circuit diagram which shows the operational condition when the memory cell of FIG. 8 is not selected during reading.
Figure 20:
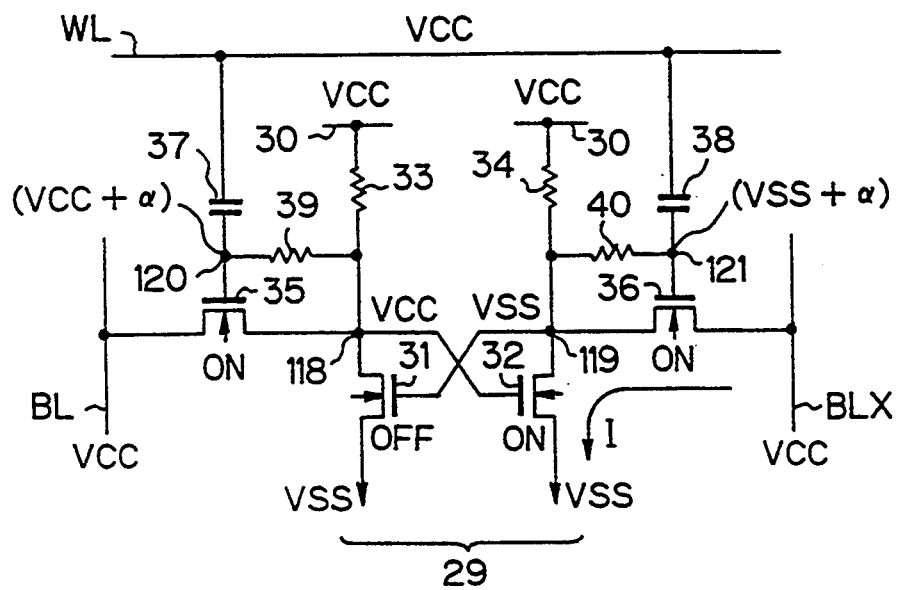
FIG. 20 is a circuit diagram which shows the operational condition when the memory cell of FIG. 8 is selected during reading.
Figure 21:
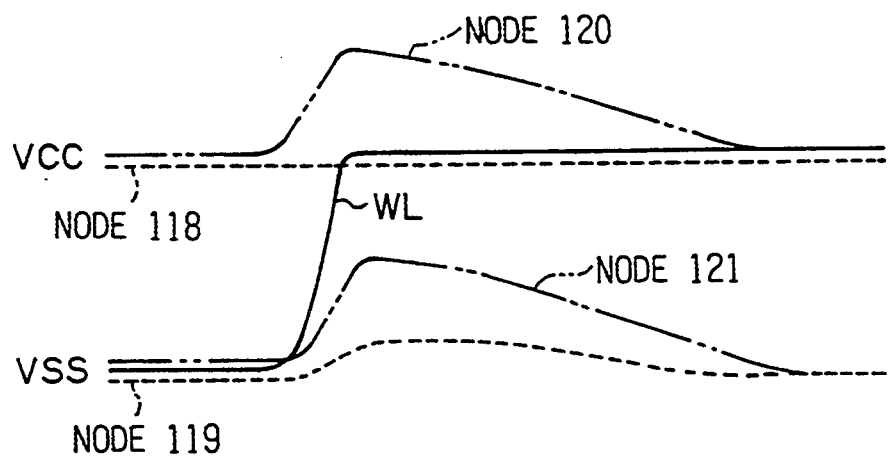
FIG. 21 is a signal waveform drawing which shows the operation of the memory cell of FIG. 8 when it is selected during reading.

4. Reading Operation of the Memory Cell Shown in FIG. 8: Refer to FIG. 19 through FIG. 21.

FIG. 19 shows the operational condition when the memory cell of FIG. 8 is not selected during reading, and in the same manner, FIG. 20 shows the operational condition when the memory cell of FIG. 8 is selected during reading. FIG. 21 shows the operating signal waveforms for the case in which the memory cell of FIG. 8 is selected during reading. In the examples shown in FIG. 19 through FIG. 21, the operating condition is such that node 118=VCC and node 119=VSS, that is, nMOS transistor 31 is OFF and nMOS transistor 32 is ON.

First, when the memory cell of FIG. 8 is not selected during reading (that is, when the word line WL is not selected), as shown in FIG. 19, in addition to the potential at bit lines BL and BLX being reset to VCC through the load (not shown in the drawing), word line WL is made VSS.

In this case, because node 120 is connected to node 118 through resistor 39 and node 121 is connected to node 119 through resistor 40, node 118 is maintained at VCC and node 119 is maintained at VSS, so that nMOS transistors 35 and 36 are maintained in the OFF state.

Next, when the memory cell shown in FIG. 8 is selected during reading (that is, when the word line WL is selected), as shown in FIG. 20 and FIG. 21, in addition to bit lines BL and BLX being reset to VCC through the load (not shown in the drawing), word line WL is raised from VSS to VCC. As a result, because of the coupling action of capacitors 37 and 38, node 120 is raised to VCC+α, node 121 is raised to VSS+α, nMOS transistor 35 goes into a strong ON state, and nMOS transistor goes into a weak ON state.

Therefore, in this case, since the current I flows from the bit line BLX through nMOS transistors 36 and 32 into the VSS power supply line, this current I can be sensed by a sensing amplifier (not shown) to perform reading of data.

In this case, the potential at node 119 rises to a voltage level established by the gm of nMOS transistor 36 and the gm of nMOS transistor 32. However, because the potential at node 121 rises only to VSS+α(for example to only about VCC/2), the gm of nMOS transistor 36 becomes approximately ½ that of the case in which node 121=VCC, and the rise in the potential at node 119 is smaller than in the past.

In this case, although the rise in the potential at node 119 is small, in response to the rise in potential at this node 119, nMOS transistor 31 goes into a weak ON state and the potential at node 118 tends to drop. However, because nMOS transistor 35 is in a strong ON state, node 118 is fed with a sufficient charge from bit line BL, thereby preventing the drop of the potential at node 118.

In this manner, in the memory cell shown in FIG. 8, in the case in which node 118=VCC and node 119=VSS and also in the case in which the cell is selected during reading, the potential at node 119 does not rise very much, and the potential at node 118 does not drop.

In the same manner, in the case in which node 118=VSS and node 119=VCC, even in when the memory cell is selected during reading, the potential at node 118 does not rise very much and the potential on node 119 does not drop.

5. writing Operation of the Memory Cell Shown in FIG. 8: Refer to FIG. 22 through FIG. 25.

Figure 22:
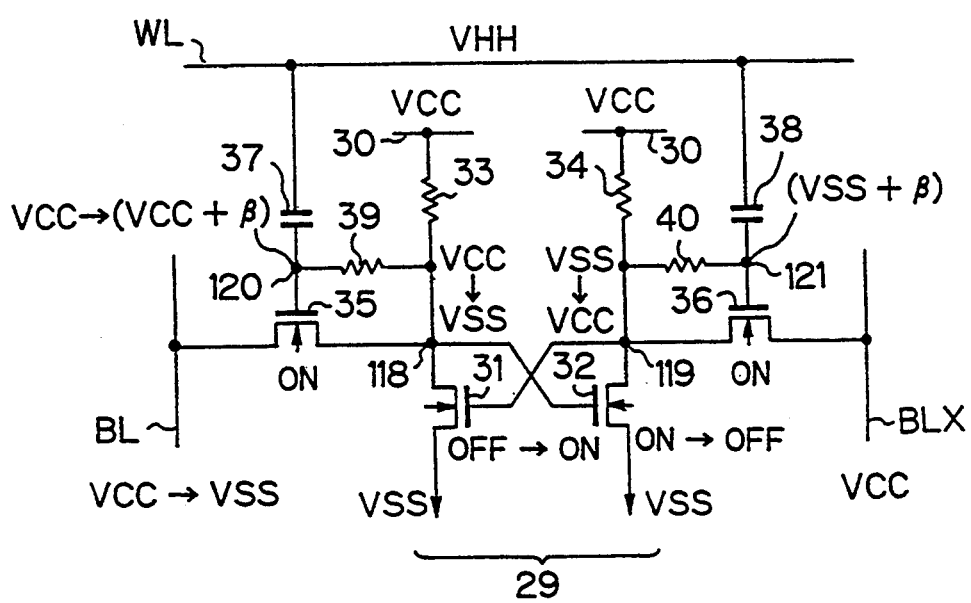
FIG. 22 is a circuit diagram which shows the operational condition when the memory cell of FIG. 8 is selected during writing.
Figure 23:
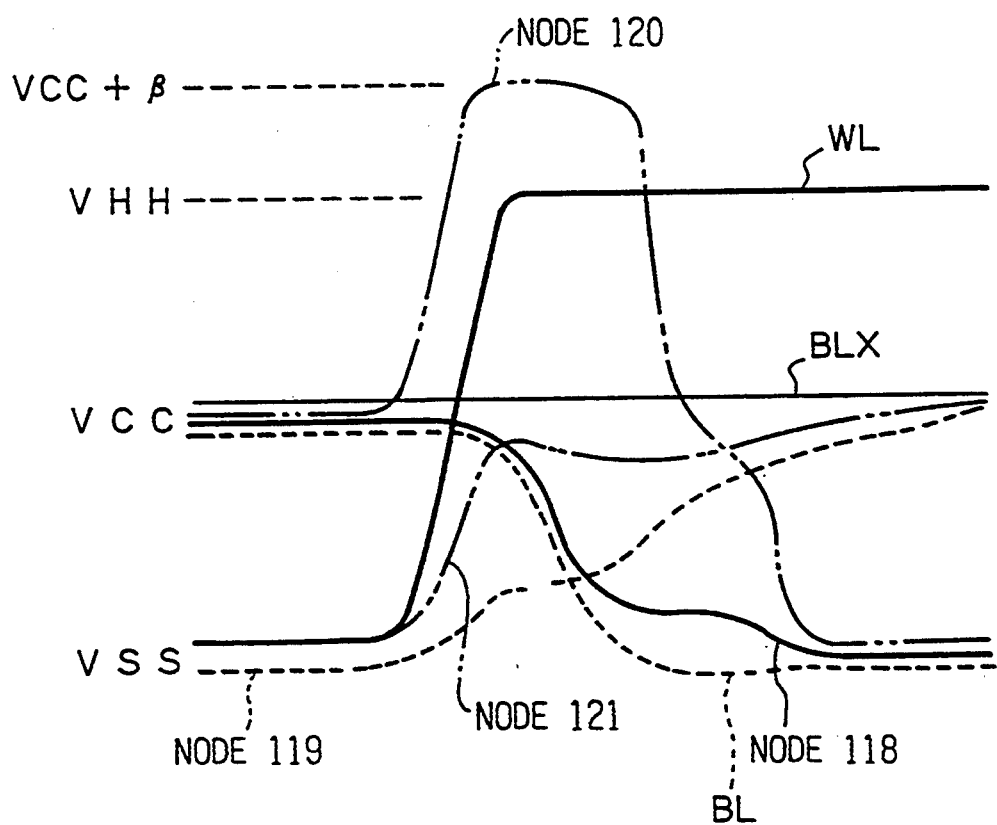
FIG. 23 is a signal waveform drawing which shows the operation when the memory cell of FIG. 8 is selected during writing.

FIG. 22 shows the operational condition when the memory cell of FIG. 8 is selected during writing, and FIG. 23 shows the operating signal waveforms when the memory cell of FIG. 8 is selected during writing. In the example shown in FIG. 22 and FIG. 23, the operating conditions are shown for the case in which a change is made from the condition in which node 118=VCC and node 119=VSS, that is, in which nMOS transistor 31 is OFF and nMOS transistor 32 is ON, to the condition in which node 118=VSS and node 119=VCC, that is, to the condition in which nMOS transistor 31 is ON and nMOS transistor 32 is OFF.

In the case in which the memory cell of FIG. 8 is selected during writing, after resetting bit lines BL and BLX to VCC, in addition to making word line WL be VHH, bit line BL is made VSS and bit line BLX is made VCC. As a result, because of the coupling action of capacitors 37 and 38, node 120=VCC+β (>α), node 121=VSS+β, nMOS transistor 35 goes into the strong ON state, and nMOS transistor 36 goes into the normal ON state.

Therefore, in this case, the charge at node 118 is removed by bit line BL, the potential at node 118 drops from VCC to VSS, and nMOS transistor is OFF. In addition to charge being supplied to node 119 from bit line BLX, because nMOS transistor 32 is OFF, the potential at node 119 rises from VSS to VCC, nMOS transistor 31 is turned ON, and writing is completed.

Figure 24:
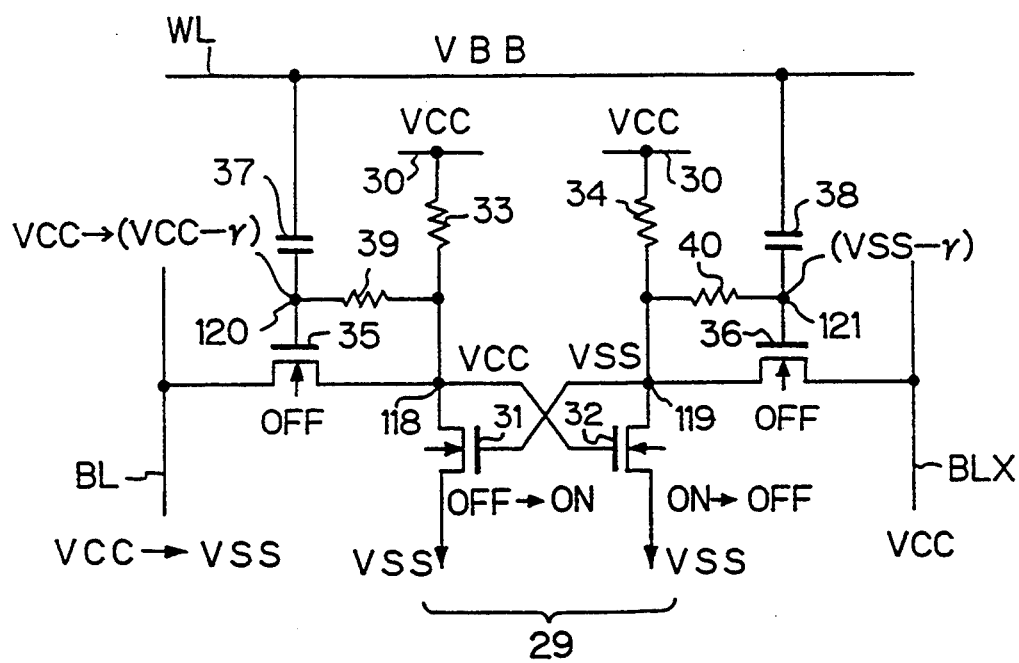
FIG. 24 is a circuit diagram which shows the operational condition when the memory cell of FIG. 8 is not selected during writing.
Figure 25:
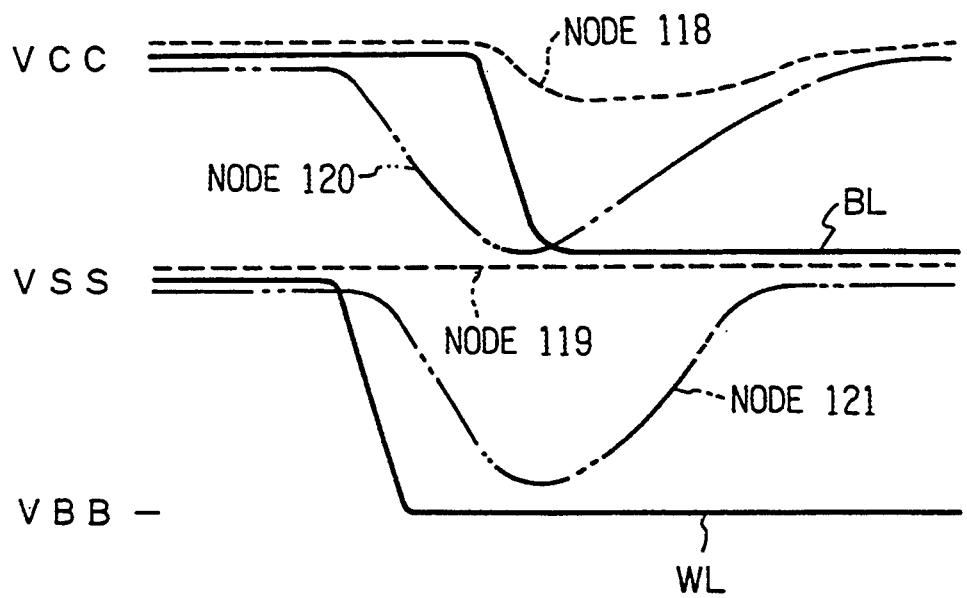
FIG. 25 is a signal waveform drawing which shows the operation when the memory cell of FIG. 8 is not selected during writing.

FIG. 24 shows the operational condition when the memory cell of FIG. 8 is not selected during writing and FIG. 25 shows the operating signal waveforms for the case in which the memory cell of FIG. 8 is not selected during writing. In the example shown in FIG. 24 and FIG. 25, the operating condition is shown for the case in which node 118=VCC and node 119=VSS, that is, for the case in which nMOS transistor 31 is OFF and nMOS transistor 32 is ON, in which case, because of the relationship of other selected memory cells which share bit lines BL and BLX, bit line BL=VSS and bit line BLX=VCC.

In this case, because word line WL=VBB, node 120=VCC−γ (for example, VSS), node 121=VSS−γ (for example, VBB), and nMOS transistors 35 and 36 are OFF.

As a result, even if node 118=VCC, the charge on this node 118 is removed by bit line BL, so that the stored data is not destroyed.

6. Effect

As described above, in this embodiment, in the case in which the memory cell of FIG. 8 is selected during reading, for the case in which node 118=VCC and node 119=VSS, in addition to preventing a large rise in the potential at node 119, it is possible to prevent a drop in potential at node 118, so that it is possible to prevent the destruction of stored data.

In addition, conversely, for the case in which node 118=VSS and node 119=VCC, in addition to preventing a large rise in the potential at node 118, it is possible to prevent a drop in potential at node 119, so that it is possible to prevent the destruction of stored data.

Therefore, according to this embodiment even if the cell ratio is made small, such as for example approximately 3, it is possible to achieve stable operation at a low operating voltage, thereby enabling the achievement of both low power consumption and a high degree of integration.

Second Embodiment: Refer to FIG. 26 through FIG. 35

Figure 26:
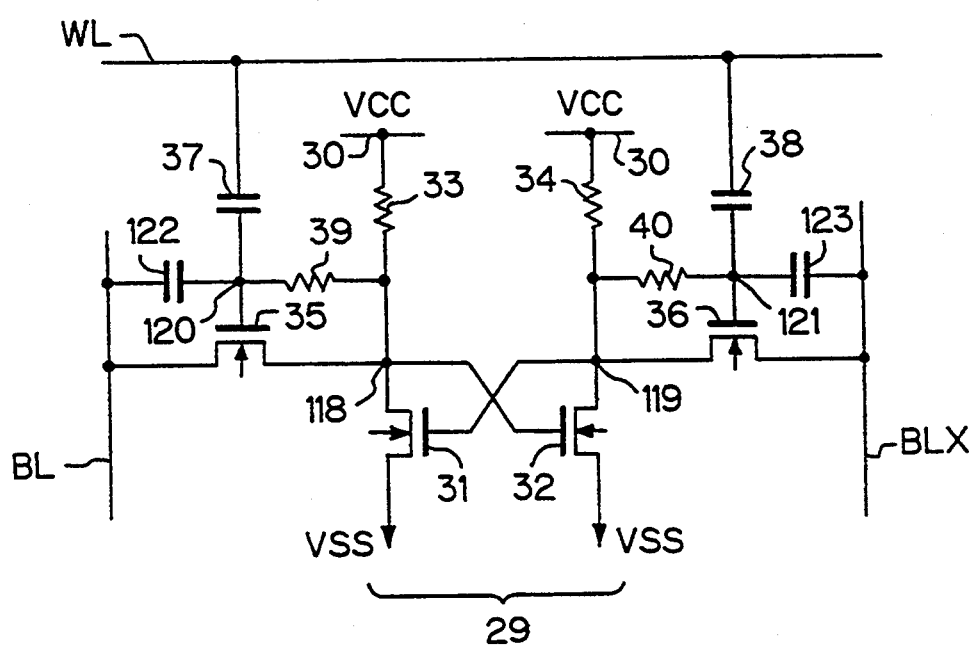
FIG. 26 is a circuit diagram which shows the configuration of memory cell provided in a static RAM of the second embodiment of the present invention.
Figure 27:
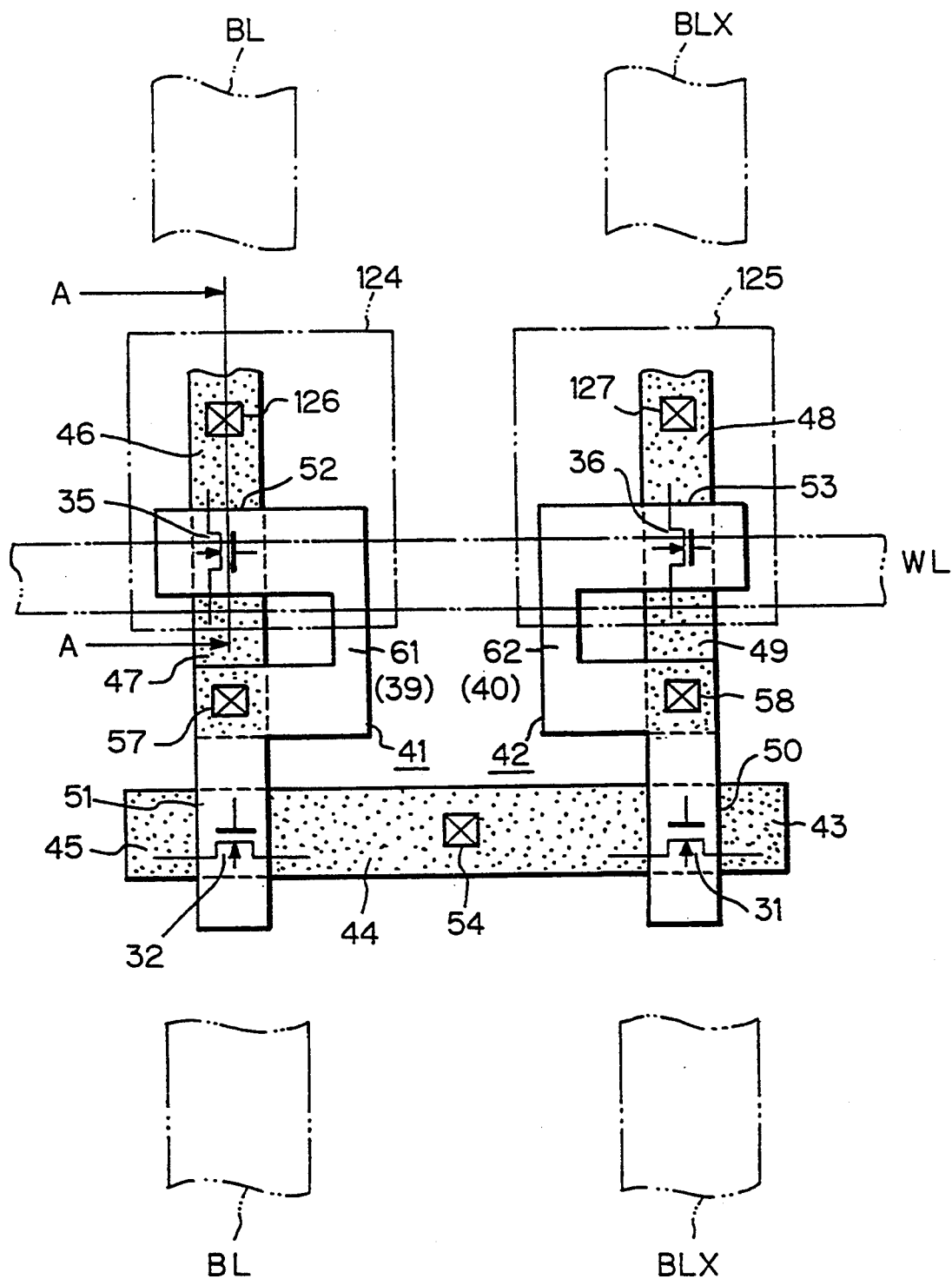
FIG. 27 is a top view which schematically shows the layout of the memory cell of FIG. 26.
Figure 28:
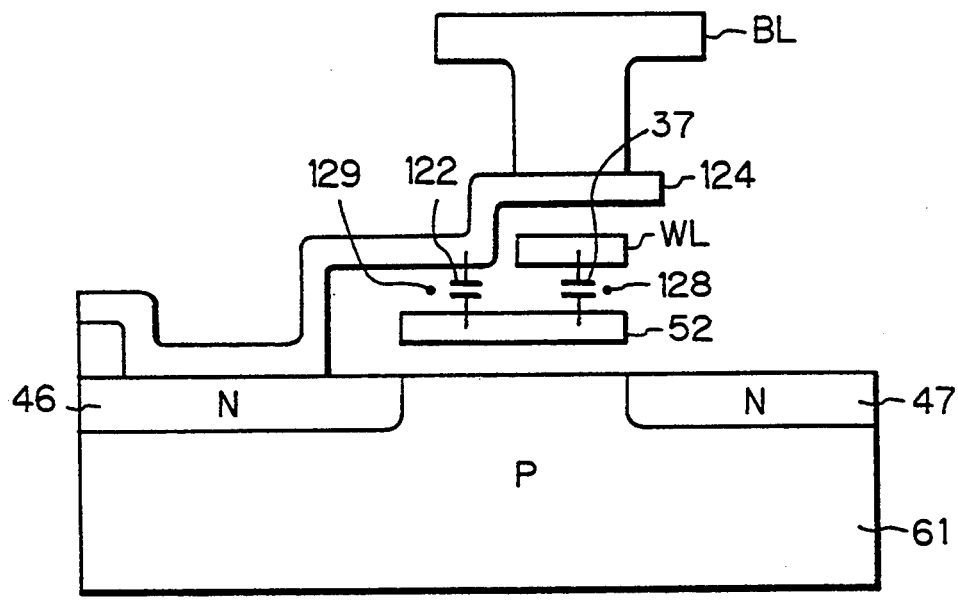
FIG. 28 is a schematic cross-sectional view along the line A—A in FIG. 27.

1. Configuration: Refer to FIG. 26 through FIG. 28.

FIG. 26 shows the configuration of the memory cell provided in an SRAM of this embodiment.

The memory cell shown in the drawing, in addition to the configuration of the memory cell shown in FIG. 8, has a capacitor 122 connected between node 120 and bit line BL, and a capacitor 123 connected between node 121 and bit line BLX.

FIG. 27 is a simplified top view which shows the layout of the memory cell of FIG. 26. In this memory cell, in contrast to the layout configuration shown in FIG. 9, there are polysilicon layers 124 and 125 provided for connections. In addition, bit line BL is connected to N-type diffusion layer 46 through polysilicon layer 124, and bit line BLX is connected to N-type diffusion layer 48 through polysilicon layer 125. 126 is a contact hole that connects polysilicon layer 124 with N-type diffusion layer 46 and 127 is a contact hole that connects polysilicon layer 125 with N-type diffusion layer 48.

FIG. 28 is a simplified cross-sectional drawing which shows the cross section cut through the line A—A in FIG. 27.

In the configuration illustrated in the drawing, capacitor 37 has one of its electrodes formed by word line WL and the other formed by part 52 of polysilicon layer 41, its electrolytic layer being formed by the insulation layer between word line WL and part 52 of polysilicon layer 41. Capacitor 112 has one of its electrodes formed by polysilicon layer 124, the other electrode formed by part 52 of polysilicon layer 41, and its electrolytic layer formed by the insulation layer 129 between polysilicon layer 124 and part 52 of polysilicon layer Although not shown in the drawing (refer to the previously described FIG. 11), capacitor 38, in the same manner, has one of its electrodes formed by word line WL, the other electrode formed by part 53 of polysilicon layer and its electrolytic layer formed by the insulation layer 64 between word line WL and part 53 of polysilicon layer 42. In the same manner, capacitor 123 has one of its electrodes formed by polysilicon layer 125, the other electrode formed by part 53 of polysilicon layer 42, and its electrolytic layer formed by the insulation layer between polysilicon layer 125 and Dart 53 of polysilicon layer 42.

Figure 29:
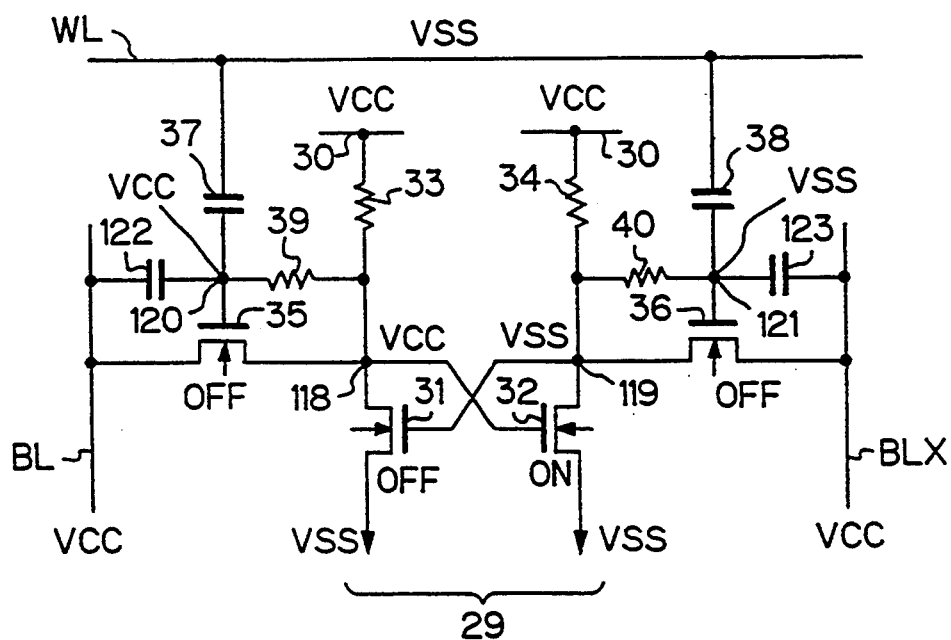
FIG. 29 is a circuit diagram which shows the operational condition when the memory cell of FIG. 26 is not selected during reading.
Figure 30:
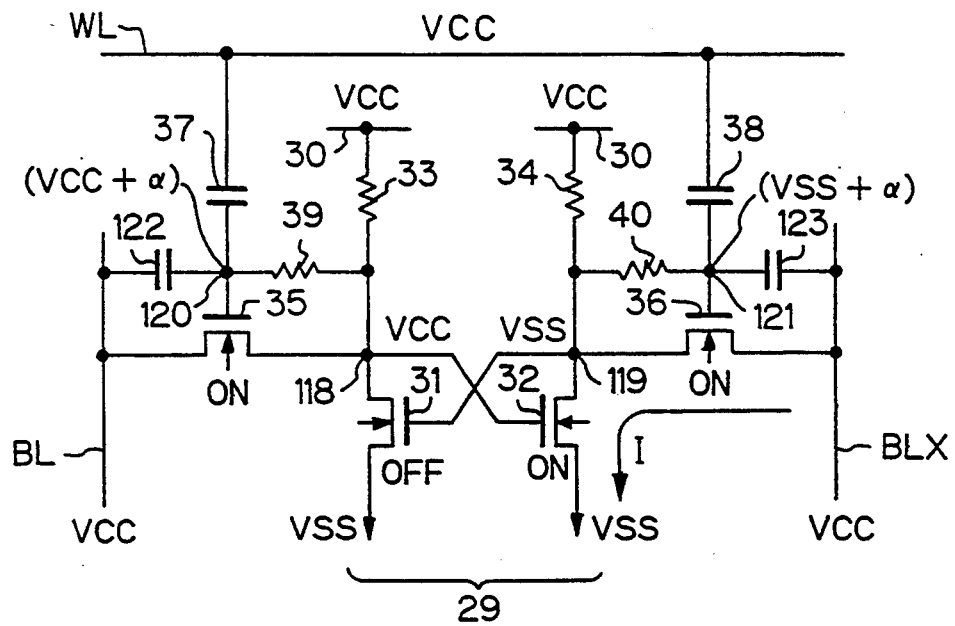
FIG. 30 is a circuit diagram which shows the operational condition when the memory cell of FIG. 26 is selected during reading.
Figure 31:
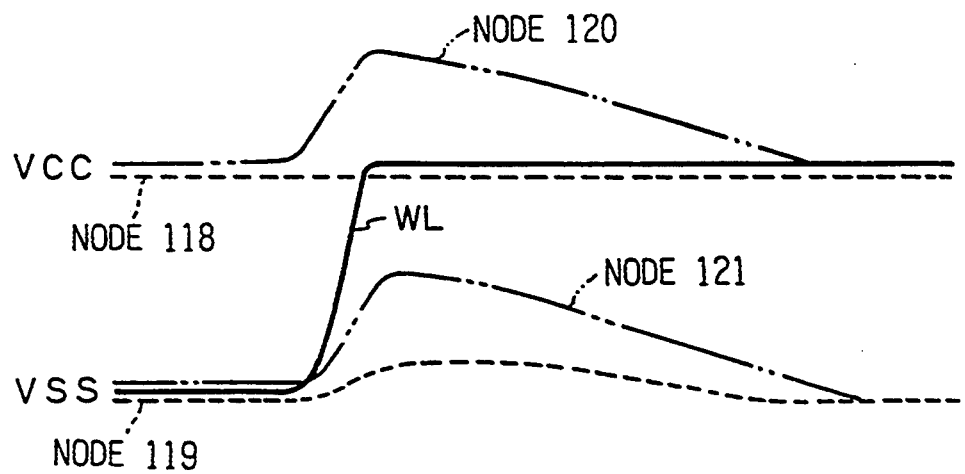
FIG. 31 is a signal waveform drawing which shows the operation when the memory cell of FIG. 26 is selected during reading.

2. Reading Operation of the Memory Cell Shown in FIG. 26: Refer to FIG. 29 through FIG. 31

FIG. 29 shows the operation condition for the case in which the memory cell shown in FIG. 26 is not selected during reading, and in the same manner FIG. 30 shows the operating condition for the case in which the memory cell shown in FIG. 26 is selected during reading. FIG. 31 shows the operating signal waveforms for the case in which the memory cell of FIG. 26 is selected during reading. In the example shown in FIG. 29 through 31, the operating condition shown is for the case in which node 118=VCC and node 119=VSS, that is, for the case in which nMOS transistor 32 is ON.

First, if the memory cell of FIG. 26 is not selected (that is, if word line W1 is not selected) during reading, as shown in FIG. 29, in addition to the potential on bit lines BL and BLX being reset to VCC through the load (not shown in the drawing), word line WL is made VSS.

In this case, because node 120 is connected to node 118 through resistor 39, node 118 is maintained at VCC and node 119 is maintained at VSS, and as a result nMOS transistors 35 and 36 are in the OFF state.

Next, in the case in which the memory cell shown in FIG. 26 is selected during reading (that is, when word line WL is selected), as shown in FIG. 30 and FIG. 31, in addition to bit lines BL and Blx being reset to VCC through the load (not shown in the drawing), word line WL is raised from VSS to VCC. As a result, because of the coupling action of capacitors 37 and 38, node 120 rises to VCC+$\alpha$, node 121 rises to VSS+$\alpha$, nMOS transistor 35 goes into the strong ON state, and nMOS transistor goes into the weak ON state.

In this case, therefore, a current I flows from bit line BLX through nMOS transistors 36 and 32 to the VSS power supply line, and this current I can be detected by a sensing amplifier (not shown in the drawing) to perform reading.

In this case, the potential at node 119 rises to a voltage level established by the gm of nMOS transistor 36 and the gm of nMOS transistor 32. However, because the potential at node 121 rises only to VSS+$\alpha$ (for example to only about VCC/2), the gm of nMOS transistor 36 becomes approximately ½ that of the case in which node 121=VCC, and the rise in the potential at node 119 is smaller than in the past.

In this case, although the rise in the potential at node 119 is small, in response to the rise in potential at this node 119, nMOS transistor 31 goes into a weak ON state and the potential at node 118 tends to drop. However, because nMOS transistor 35 is in a strong ON state, node 118 is fed with a sufficient charge from bit line BL, thereby preventing the drop of the potential at node 118.

In this manner, in the memory cell shown in FIG. 26, in the case in which node 118=VCC and node 119=VSS. When the cell is selected during reading, the potential at node 119 does not rise very much, and the potential at node 118 does not drop.

In the same manner, in the case in which node 118=VSS and node 119=VCC, even in when the memory cell is selected during reading, the potential at node 118 does not rise very much and the potential on node 119 does not drop.

3. Writing Operation of the Memory Cell Shown in FIG. 26: Refer to FIG. 32 through FIG. 35

Figure 32:
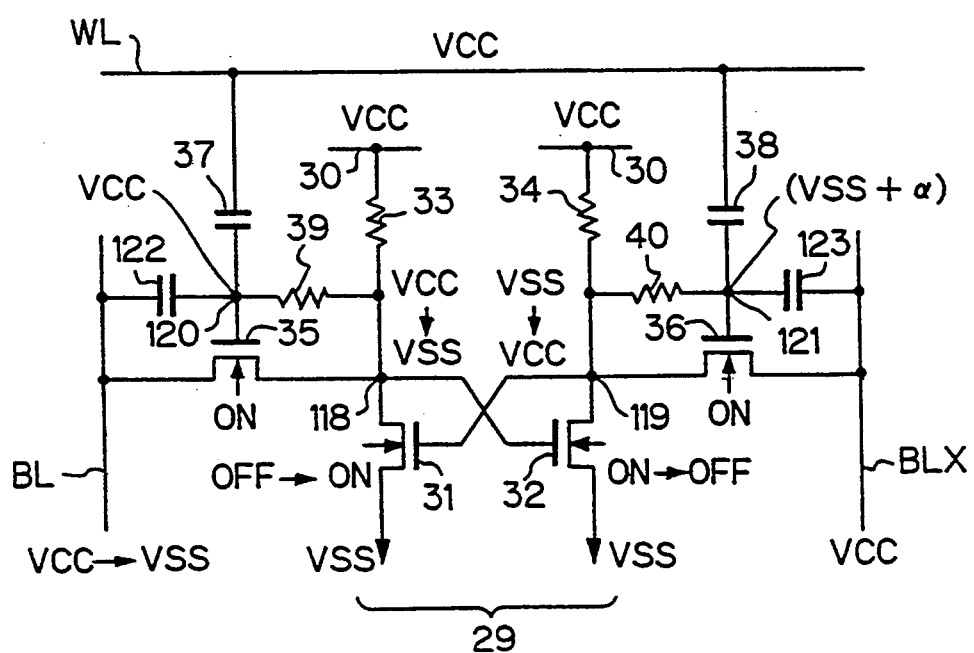
FIG. 32 is a circuit diagram which shows the operational condition when the memory cell of FIG. 26 is selected during writing.
Figure 33:
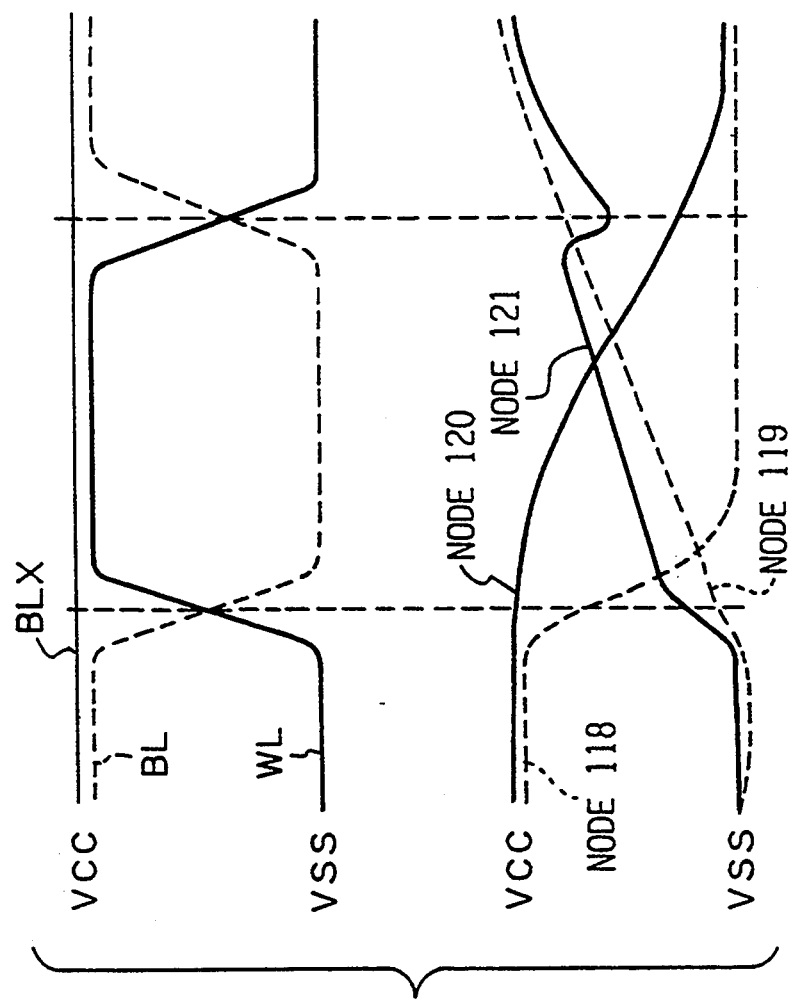
FIG. 33 is a signal waveform drawing which shows the operation when the memory cell of FIG. 26 is selected during writing.

FIG. 32 shows the operating condition for the case in which the memory cell of FIG. 26 is selected during writing, and FIG. 33 shows the operating signal waveforms for the case in which the memory cell of FIG. 26 is selected during writing. In the example shown in FIG. 32 and FIG. 33, the operating condition is shown for the case in which a change is made from the condition in which node 118=VCC and node 119=VSS, that is, from the condition in which nMOS transistor 31 is OFF and nMOS transistor 32 is ON, to the condition in which node 118=VSS and node 119=VCC, that is, to the condition in which nMOS transistor 31 is ON and nMOS transistor 32 is OFF.

In the case in which the memory cell of FIG. 26 is selected during writing, after bit lines BL and BLX are reset to VCC, in addition to setting word line WL to VCC, bit line BL is set to VSS and bit line BLX is set to VCC.

As a result, the potential on node 120 tends to rise to VCC+$\alpha$ because of the coupling action of capacitor 37 and to drop to VCC−$\alpha$ because of the coupling action of capacitor 122. As a result, node 120 is maintained at VCC. Because of the coupling action of capacitor 38, the potential at node 121 is made VSS+α, nMOS transistor 35 goes into the strong ON state, and nMOS transistor 36 goes into the weak ON state.

In this case, therefore, the charge at node 118 is released by bit line BL, the potential at node 118 drops from VCC to VSS, and nMOS transistor 32 goes into the OFF state. In addition to charge being supplied from line BLX to node 119, because nMOS transistor 32 is OFF, the potential at node 119 rises from VSS to VCC, nMOS transistor 31 is ON, and writing is completed.

Figure 34:
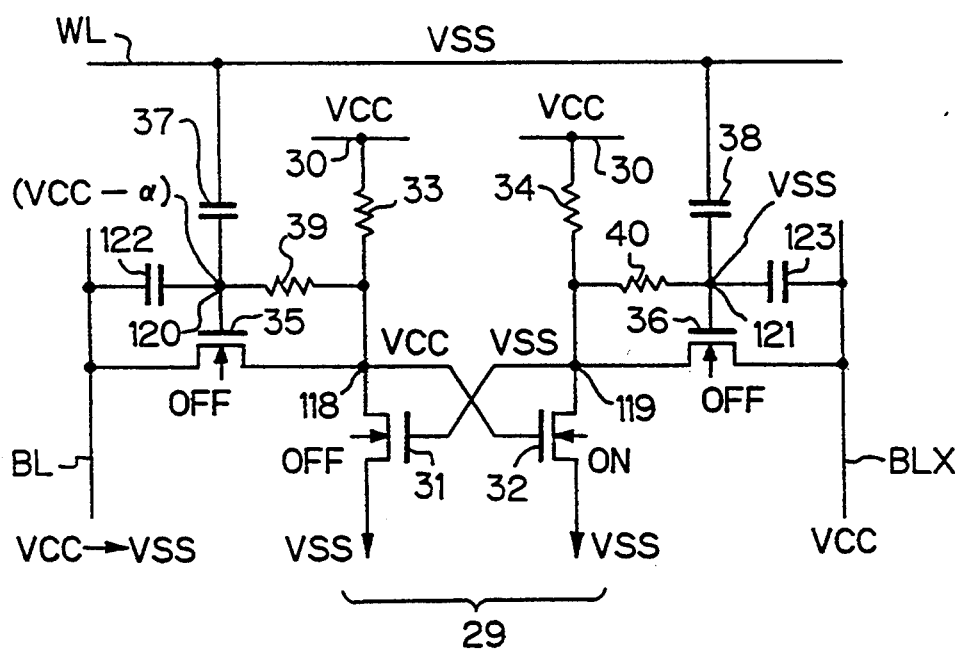
FIG. 34 is a circuit diagram which shows the operational condition when the memory cell of FIG. 26 is not selected during writing.
Figure 35:
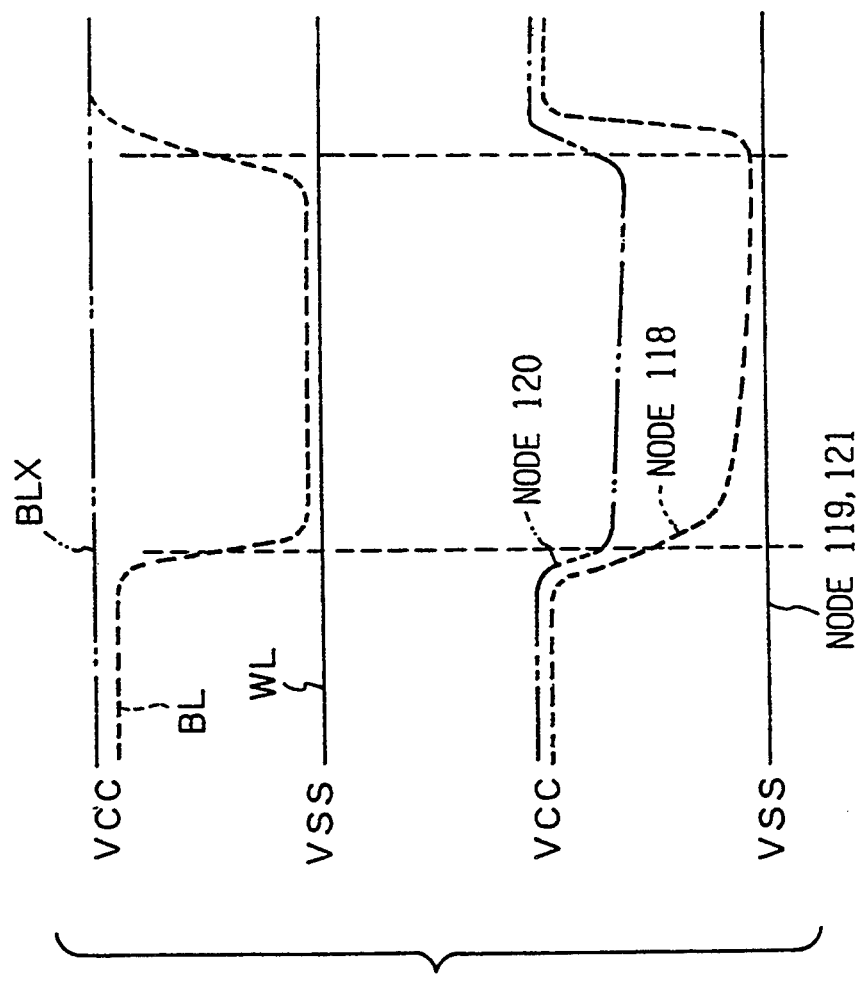
FIG. 35 is a signal waveform drawing which shows the operation when the memory cell of FIG. 26 is not selected during writing.

FIG. 34 shows the operating condition for the case in which the memory cell of FIG. 26 is not selected during writing, and FIG. 35 shows the operating signal waveforms for the case in which the memory cell of FIG. 26 is not selected during writing. In the example of FIG. 34 and FIG. 35, the operating condition shown for the case in which node 118=VCC and node 119=VSS, that is, for the case in which nMOS transistor 31 is OFF and nMOS transistor 32 is ON, and in which because of the relationship of other selected memory cells which share bit lines BL and BLX, bit line BL=VSS and bit line BLX=VCC.

In this case, because word line WL is maintained at VSS, the potential at node 120, because of the coupling effect of capacitor 122 which occurs as a result of the drop in the potential at bit line BL from VCC to VSS, drops to VCC−α, node 121 being maintained at VSS.

In this case, therefore, nMOS transistor 35 is in a weak ON state and nMOS transistor 36 is turned OFF. As a result, node 118 becomes VSS, so that stored data is temporarily destroyed. However, in the case in which the potential at bit line BL returns from VSS to VCC, since node 120 is then VCC, node 118 returns to VCC, thereby correcting the stored data.

4. Effect

As described above, in this embodiment, when the memory cell of FIG. 26 is selected during writing, in the case in which node 118=VCC and node 119=VSS, in addition to preventing a large rise in potential at node 119, it is possible to prevent a drop in potential at node 118, so that it is possible to prevent the destruction of stored data.

Conversely, in the case in which node 118=VSS and node 119=VCC, in addition to preventing a large rise in potential at node 118, it is possible to prevent a drop in potential at node 119, so that it is possible to prevent the destruction of stored data.

Therefore, according to this embodiment even if the cell ratio is made small, such as for example approximately 3, it is possible to achieve stable operation at a low operating voltage, thereby enabling the achievement of both low power consumption and a high level of integration.

In addition, in this embodiment in particular, when writing, since the potential at the word line connected to a selected memory cell is VCC and the potential at the word line connected to a non-selected memory cell is VSS, it is not necessary to have a circuit to supply a high voltage VHH and a negative voltage VBB to the word line, as was provided in the first embodiment.

Figure 36:
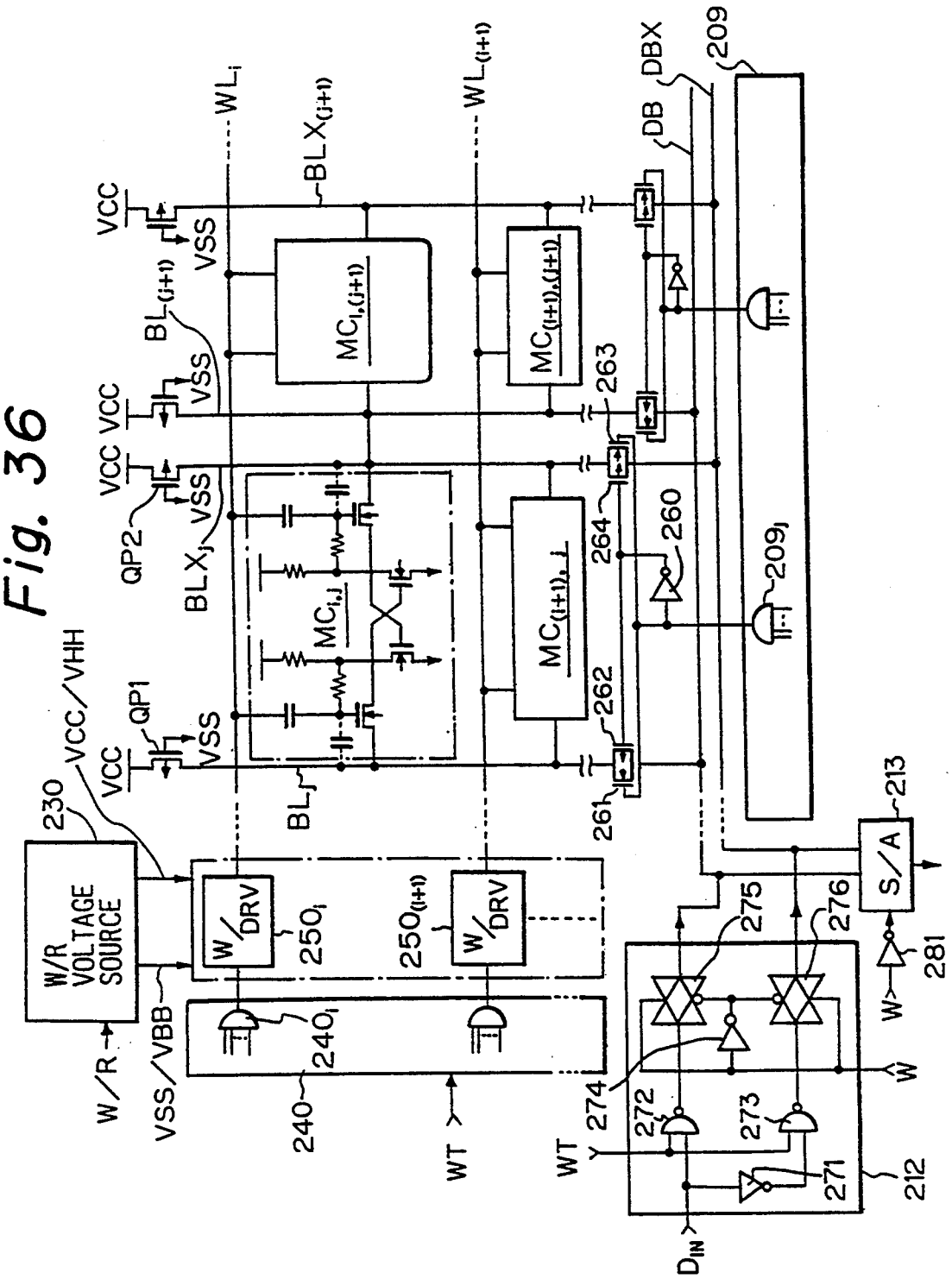
FIG. 36 is a diagram which shows the circuit configuration of the memory cell array of FIG. 7 and the peripheral area.

Furthermore, as a reference, FIG. 36 shows the circuit configuration of the memory cell array of FIG. 7 and surrounding area.

In this drawing, MCij shows a static type memory cell (refer to FIG. 8 and FIG. 26) which has as a basic element a flip-flop, this memory cell, as shown in the drawing, being connected at the intersection of a plurality of word lines WLi and a plurality of complementary bit line pairs BLj, BLXj. Furthermore, at one end of each of the complementary bit line pairs BLj, BLXj pMOS transistors QP1 and QP2 connected between the high-potential power supply lines VCC serve as loads for these bit lines.

230 is a W/R voltage source which generates the W/R voltage VCC/VHH and VSS/VBB based on the W/R control signal from the W/R control circuit 207 (refer to FIG. 7), 240 is a row decoder which has AND gates which decode the internal row address signals for each of the word lines in response to the write timing signal WT supplied from the W/R control circuit 207, and 250i is a word line drive circuit (W/DRV) which drives the appropriate word line WLi, according to the output of the corresponding AND gate within the row decoder 240. The word line drive circuit 208 shown in FIG. 7 is formed by the W/R voltage source 230, the row decoder 240, and the word line drive circuit 250i.

260 is an inverter which responds to the output of the corresponding AND gate 209i of the column within the column decoder 209, 261 and 262 are an nMOS transistor and DMOS transistor (column gate), respectively, which respond to the output of the AND gate 209i and inverter 260, and in the same manner 263 and 264 are an nMOS transistor and pMOS transistor (column gate), respectively, which respond to the output of the AND gate 209j and the inverter 260. When each of these column gates is selected, the corresponding bit lines BLj and BLXj are connected to one pair of data lines DB and DBX. Inverter 260 and each of the MOS transistors 261 through 264 form the column selector and I/O gate 210 shown in FIG. 7.

W/A circuit 212 is configured to have an inverter 271 which responds to the input data DIN, a NAND gate 272 which responds to the writing timing signal WT and the input data $D_{IN}$, an inverter 274 which responds to the write signal W which is supplied from the W/R control circuit 207 (refer to FIG. 7), a transmission gate 275 which controls passage or cutoff of the output of the NAND gate 272 in response to the write signal W and the output of the inverter 274, and a transmission gate 276 which, in the same manner, controls passage or cutoff of the output of the NAND gate 273 in response to the write signal W and the output of the inverter 274. Each of the transmission gates 275 and 276 has its output connected to the data lines DB and DBX. The data lines DB and DBX are connected to S/A circuit 213, this S/A circuit having an input of the write signal W via inverter 281.

Finally, the results of an investigation of the resistance values of the resistors used in the memory cell of the embodiment of the present invention (resistors 39 and 40 of FIG. 8 and FIG. 26) is given below.

First Embodiment

1. During Reading: Refer to FIG. 20

If we make the gate capacitances of each of the transfer gate transistors 35 and 36 be Cg and the coupling capacitances with respect to word line WL (the capacitances of capacitors 37 and 38) be Cw, to read in, for example, 10 ns, the following equation applies.

$$(Cg+Cw) \cdot R \geq 10 \text{ ns}$$

If $Cg=Cw=0.5$ fF, the resistance value R is given as follows.

$$R \geq 10 \text{ M}\omega$$

2. During Writing (Selected): Refer to FIG. 22

If we make the capacitance of flip-flop 29 be Cf, the currents flowing in the transfer gate transistors 35 and 36 be $I_1$ and $I_2$, and make the current flowing in the drive transistors 31 and 32 be $I_3$ and $I_4$, the potentials at node and node 121 must rise due to the coupling action of capacitors 37 and 38 during a time period $\tau$, which satisfies the following relationship.

(SUUSHIKI 1)

If values are set so that $$I_1 = -\beta \cdot VCC \{VCC/2 + VHH \cdot Cw/(Cg+Cw) - V_{th}\}$$

$$I_2 = -\beta/2 \{VHH \cdot Cw/(Cg+Cw) - V_{th}\}^2$$

and $$I_3 = 0 \text{ and } I_4 = 0,$$

it is possible to rewrite the above equations as follows.

$$Cf \cdot VCC - \beta \cdot VCC \{VCC/2 + VHH \cdot Cw/(Cg+Cw) - V_{th}\}^2 \tau \leq \beta/2 \times \{VHH \cdot Cw/(Cg+Cw) - V_{th}\}^2 \tau$$

If $V^{th}=1$ [V], VCC=2 [V], VHH=4 [V], $Cg=Cw=0.5$ [fF], $Cf=2$ [fF], and $\beta=4$ [$\mu$A/V$^2$], this can be further re-written as follows.

$$4 \text{ [fc]} - 8\{1+2-1\}\tau \leq 2\{2-1\}^2 \tau \therefore \tau \geq 4 \text{ [fC]}/18 \text{ [}\mu\text{A]} \sim 0.22 \text{ [ns]}$$

Since the condition $(Cg+Cw) \cdot R \geq \tau$ needs to be met the resistance value R is given as follows.

$$R \geq 222 \text{ [k}\omega\text{]}$$

3. During Writing (Not Selected): Refer to FIG. 24

In this case, since a positive charge is present at node 118, the following equation applies.

(SUUSHIKI 2)

In the above, $V_{120}$ is the potential on node 120.

Since $V^{th}=1$ [V], even if the potential on node 118 drops, it is only to 1 [V]. Therefore, the discharging is only down to $Cf \times 1$ [V]. If VBB is made $-2$ [V], the above equation can be rewritten as follows.

$$4 \text{ [fC]} - 2 \text{ [fC]} - \tau/R \geq 0$$

Since $\tau \geq 0.22$ [ns], the resistance value R is given as follows.

$$R \geq 222 \text{ [k}\omega\text{]}$$

Essentially, because the limitation on reading time is the most severe, it is desirable to set the value of R to 10 M$\omega$ or higher.

Second Embodiment

1. During Reading: Refer to FIG. 30

In the same manner, if we make the gate capacitances of each of the transfer gate transistors 35 and 36 be Cg, make the coupling capacitances with respect to word line WL (the capacitances of capacitors 37 and 38) be Cw, and make the coupling capacitances (the capacitances of capacitors 122 and 123) with respect to the bit lines BL and BLX be to read in, for example, 10 ns, the following equation applies.

$$(Cg+Cw+Cb) \cdot R \geq 10 \text{ [ns]}$$

If $Cg=Cb=0.5$ [fF] and $Cw=2$ [fF] the resistance value R is given as follows.

$$R \geq 3.3 \text{ M}\omega$$

2. During Writing (Selected): Refer to FIG. 22

In the same manner as for the first embodiment, the following equation applies.

(SUUSHIKI 3)

If values are set so that $$I_1 = \beta \cdot VCC \{VCC/2 + VCC \cdot Cw/(Cg+Cw+Cb) - VCC \cdot Cb/(Cg+Cw+Cb) - V_{th}\}$$

$$I_2 = -\beta/2 \{VCC \cdot Cw/(Cg+Cw+Cb) - V_{th}\}^2$$

and $$I_3 \sim 0 \text{ and } I_4 \sim 0.$$

and further set values such that $V^{th}=1$ [V], VCC=2 [V], $Cg=Cb=0.5$ [fF], $Cw=2$ [fF], $Cf=4$ [fF], and $\beta=4$ [$\mu$AV$^2$], the above equation can be rewritten as follows.

$$8 \text{ [fC]} \leq 38/9 \text{ [}\mu\text{A]} \tau \therefore \tau \geq 1.89 \text{ [ns]}$$

Since it is necessary to meet the condition $(Cg+Cw+Cb) \cdot R \geq \tau$, the resistance value R is given as follows.

$$R \geq 630 \text{ [k}\omega\text{]}$$

3. During Writing (Not Selected): Refer to FIG. 34

In the same manner as for the first embodiment, the following equation applies.

(SUUSHIKI 4)

In this case, even if the potential on node 118 drops, it is only to 1 [V]. Therefore, the above equation can be rewritten as follows.

$$4 \text{ [fC]} - \tfrac{8}{9}[\text{fC}] \cdot \tau/R \geq 0$$

Since $\tau \geq 1.89$ [ns], the resistance value R is given as follows.

$$R \geq 310 \text{ [k}\omega\text{]}$$

Thus, in the same manner as for the first embodiment, because the limitation on reading time is the most severe, it is desirable to set the value of R to 3.3 M$\omega$ or higher.

Although two embodiments of the present invention have been disclosed and described, it will be apparent to a person skilled in the art that other embodiments and modifications of the present invention are possible without departing from the essential features of the present invention.

I claim:

1. A static type semiconductor memory device including a memory cell comprising:
   a flip-flop having first and second nodes;
   a first transfer gate transistor connected between a first bit line of a complementary pair of bit lines and a said first node;
   a second transfer gate transistor connected between the second bit line of said complementary pair of bit lines and said second node;
   a first capacitor connected between a word line and the gate of said first transfer gate; and
   a second capacitor connected between said word line and the gate of said second transfer gate.

2. A static type semiconductor memory device according to claim 1, further comprising a first resistance means connected between the gate of said first transfer gate transistor and said first node, and a second resistance means connected between the gate of said second transfer gate transistor and said second node.

3. A static type semiconductor memory device according to claim 2, further comprising a word line drive circuit, said word line drive circuit applying to a non-selected word line in the write mode a low voltage which is lower than a low-potential power supply voltage of said flip-flop.

4. A static type semiconductor memory device according to claim 3, wherein said word line drive circuit applies to a selected word line in the write mode a high voltage which is higher than a high-potential power supply voltage of said flip-flop.

5. A static type semiconductor memory device according to claim 1, wherein said first capacitor is formed by providing a first insulation layer between said word line and the gate of said first transfer gate, and wherein said second capacitor is formed by providing a second insulation layer between said word line and the gate of said second transfer gate.

6. A static type semiconductor memory device according to claim 1, further comprising a third capacitor connected between said first bit line and the gate of said first transfer gate, and a fourth capacitor connected between said second bit line and the gate of said second transfer gate.

7. A static type semiconductor memory device according to claim 1, wherein said first transfer gate transistor and said second transfer gate transistor are each formed by a transistor having a double-gate structure.

8. A static type semiconductor memory device including a memory cell comprising:
   a first load element and a second load element, one end of each of which is connected to a first power supply line that supplies a high-potential power supply voltage;
   a first transistor, the drain of which is connected to the other end of said first load element, the source of which is connected to a second power supply line which supplies a low-potential power supply voltage, and the gate of which is connected to the other end said second load element;
   a second transistor, the drain of which is connected to the other end of said second load element, the source of which is connected to said second power supply line, and the gate of which is connected to the other end of said first load element;
   a third transistor, the drain of which is connected to a first of a pair of complementary bit lines and the source of which is connected to the other end of said first load element;
   a fourth transistor, the drain of which is connected to a second of said pair of complementary bit lines and the source of which is connected to the other end of said second load element;
   a first capacitor, one end of which is connected to a word line and the other end of which is connected to the gate of said third transistor;
   a second capacitor, one end of which is connected to said word line and the other end of which is connected to the gate of said fourth transistor;
   a first resistance means, one end of which is connected to the gate of said third transistor and the other end of which is connected to the other end of said first load element;
   a second resistance means, one end of which is connected to the gate of said fourth transistor and the other end of which is connected to the other end of said second load element;
   a third capacitor, one end of which is connected to said first bit line and the other end of which is connected to the gate of said third transistor; and
   a fourth capacitor, one end of which is connected to said second bit line and the other end of which is connected to the gate of said fourth transistor.

9. A static type semiconductor memory device according to claim 8, comprising a word line drive circuit which controls the voltage level on the word line depending upon whether said memory cell is selected or non-selected, said word line drive circuit, in the case in which said memory cell is selected when writing, applying to the corresponding word line a high voltage which is higher than said high-potential power supply voltage.

10. A static type semiconductor memory device according to claim 8, wherein said first capacitor is formed by providing a first insulation layer between said word line and the gate of said third transistor, and wherein said second capacitor is formed by providing a second insulation layer between said word line and the gate of said forth transistor.

11. A static type semiconductor memory device according to claim 8, wherein said third capacitor is formed by providing a first insulation layer between a first conductive layer connected to said first bit line and the gate of said third transistor, and wherein said fourth capacitor is formed by a providing a second insulation layer between a second conductive layer connected to said second bit line and the gate of said fourth transistor.

12. A static type semiconductor memory device according to claim 8, wherein said third and fourth transistors are each formed by a transistor having a double-gate structure.

* * * * *